US009123555B2

(12) United States Patent
Crisp et al.

(10) Patent No.: US 9,123,555 B2
(45) Date of Patent: Sep. 1, 2015

(54) CO-SUPPORT FOR XFD PACKAGING

(71) Applicant: Invensas Corporation, San Jose, CA (US)

(72) Inventors: Richard Dewitt Crisp, Hornitos, CA (US); Belgacem Haba, Saratoga, CA (US); Wael Zohni, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 123 days.

(21) Appl. No.: 14/063,119

(22) Filed: Oct. 25, 2013

(65) Prior Publication Data

US 2015/0115472 A1    Apr. 30, 2015

(51) Int. Cl.
| | |
|---|---|
| *H01L 23/02* | (2006.01) |
| *H01L 25/065* | (2006.01) |
| *H01L 23/00* | (2006.01) |
| *H01L 23/50* | (2006.01) |

(52) U.S. Cl.
CPC ............ *H01L 25/0657* (2013.01); *H01L 23/50* (2013.01); *H01L 24/09* (2013.01); *H01L 2224/023* (2013.01); *H01L 2224/04042* (2013.01); *H01L 2224/09151* (2013.01); *H01L 2225/0651* (2013.01); *H01L 2225/06562* (2013.01); *H01L 2924/14361* (2013.01)

(58) Field of Classification Search
CPC ........... H01L 2224/16145; H01L 2924/15311; H01L 2224/4824; H01L 2224/73215; H01L 2224/32145; H01L 2225/1023; H01L 2224/97
USPC .................. 257/686, 777, 723, 724, 784, 786
See application file for complete search history.

(56) References Cited

U.S. PATENT DOCUMENTS

| | | |
|---|---|---|
| 3,670,208 A | 6/1972 | Hovnanian et al. |
| 4,747,081 A | 5/1988 | Heilveil et al. |
| 5,128,737 A | 7/1992 | van der Have |
| 5,148,265 A | 9/1992 | Khandros et al. |
| 5,148,266 A | 9/1992 | Khandros et al. |
| 5,163,024 A | 11/1992 | Heilveil et al. |
| 5,210,639 A | 5/1993 | Redwine et al. |

(Continued)

FOREIGN PATENT DOCUMENTS

| | | |
|---|---|---|
| EP | 1205977 A2 | 5/2002 |
| JP | 2002-076252 A | 3/2002 |

(Continued)

OTHER PUBLICATIONS

U.S. Appl. No. 13/346,185, filed Jan. 9, 2012.

(Continued)

*Primary Examiner* — S. V. Clark
(74) *Attorney, Agent, or Firm* — Lerner, David, Littenberg, Krumholz & Mentlik, LLP

(57) ABSTRACT

A microelectronic package has a dielectric element with first and second parallel apertures. A first microelectronic element has contacts overlying the first aperture, and a second microelectronic element has contacts overlying the second aperture. The second microelectronic element can overlie a rear face of the first microelectronic element and the same surface of the dielectric element as the first microelectronic element. First terminals on a second surface of the dielectric element between said first and second apertures can be configured to carry all data signals for read and write access to memory locations within the first and second microelectronic elements.

25 Claims, 18 Drawing Sheets

(56) References Cited

U.S. PATENT DOCUMENTS

| | | | |
|---|---|---|---|
| 5,480,840 A | 1/1996 | Barnes et al. | |
| 5,679,977 A | 10/1997 | Khandros et al. | |
| 5,777,391 A | 7/1998 | Nakamura et al. | |
| 5,821,614 A | 10/1998 | Hashimoto et al. | |
| 5,929,517 A | 7/1999 | Distefano et al. | |
| 5,936,305 A | 8/1999 | Akram | |
| 5,973,403 A | 10/1999 | Wark | |
| 6,086,386 A | 7/2000 | Fjelstad et al. | |
| 6,130,116 A | 10/2000 | Smith et al. | |
| 6,197,665 B1 | 3/2001 | DiStefano et al. | |
| 6,252,264 B1 | 6/2001 | Bailey et al. | |
| 6,255,899 B1 | 7/2001 | Bertin et al. | |
| 6,261,867 B1 | 7/2001 | Robichaud et al. | |
| 6,297,960 B1 | 10/2001 | Moden et al. | |
| 6,323,436 B1 | 11/2001 | Hedrick et al. | |
| 6,343,019 B1 | 1/2002 | Jiang et al. | |
| 6,376,769 B1 | 4/2002 | Chung | |
| 6,380,318 B1 | 4/2002 | Saito et al. | |
| 6,384,473 B1 | 5/2002 | Peterson et al. | |
| 6,385,049 B1 | 5/2002 | Chia-Yu et al. | |
| 6,414,396 B1 | 7/2002 | Shim et al. | |
| 6,426,560 B1 | 7/2002 | Kawamura et al. | |
| 6,433,422 B1 | 8/2002 | Yamasaki | |
| 6,445,594 B1 | 9/2002 | Nakagawa et al. | |
| 6,452,266 B1 | 9/2002 | Iwaya et al. | |
| 6,461,895 B1 | 10/2002 | Liang et al. | |
| 6,462,423 B1 | 10/2002 | Akram et al. | |
| 6,560,134 B2 | 5/2003 | Brox et al. | |
| 6,577,004 B1 | 6/2003 | Rumsey et al. | |
| 6,583,502 B2 | 6/2003 | Lee et al. | |
| 6,617,695 B1 | 9/2003 | Kasatani | |
| 6,619,973 B2 | 9/2003 | Perino et al. | |
| 6,620,648 B2 | 9/2003 | Yang | |
| 6,633,078 B2 | 10/2003 | Hamaguchi et al. | |
| 6,661,089 B2 | 12/2003 | Huang | |
| 6,692,987 B2 | 2/2004 | Lim et al. | |
| 6,703,713 B1 | 3/2004 | Tseng et al. | |
| 6,707,141 B2 | 3/2004 | Akram | |
| 6,720,666 B2 | 4/2004 | Lim et al. | |
| 6,742,098 B1 | 5/2004 | Halbert et al. | |
| 6,744,137 B2 | 6/2004 | Kinsman | |
| 6,765,288 B2 | 7/2004 | Damberg | |
| 6,781,220 B2 | 8/2004 | Taube et al. | |
| 6,784,026 B2 | 8/2004 | Parks | |
| 6,811,580 B1 | 11/2004 | Littecke | |
| 6,821,815 B2 | 11/2004 | Smith et al. | |
| 6,836,007 B2 | 12/2004 | Michii et al. | |
| 6,876,088 B2 | 4/2005 | Harvey | |
| 6,894,379 B2 | 5/2005 | Feurle | |
| 6,894,381 B2 | 5/2005 | Hetzel et al. | |
| 6,906,415 B2 | 6/2005 | Jiang et al. | |
| 6,943,057 B1 | 9/2005 | Shim et al. | |
| 6,977,440 B2 | 12/2005 | Pflughaupt et al. | |
| 6,982,485 B1 | 1/2006 | Lee et al. | |
| 7,061,092 B2 | 6/2006 | Akram et al. | |
| 7,061,105 B2 | 6/2006 | Masuda et al. | |
| 7,061,121 B2 | 6/2006 | Haba | |
| 7,091,064 B2 | 8/2006 | Jiang | |
| 7,095,104 B2 | 8/2006 | Blackshear | |
| 7,138,709 B2 | 11/2006 | Kumamoto | |
| 7,145,226 B2 | 12/2006 | Kumamoto | |
| 7,151,319 B2 | 12/2006 | Iida et al. | |
| 7,170,158 B2 | 1/2007 | Choi et al. | |
| 7,262,507 B2 | 8/2007 | Hino et al. | |
| 7,272,888 B2 | 9/2007 | DiStefano | |
| 7,294,928 B2 | 11/2007 | Bang et al. | |
| 7,324,352 B2 | 1/2008 | Goodwin | |
| 7,368,319 B2 | 5/2008 | Ha et al. | |
| 7,372,169 B2 | 5/2008 | Chang | |
| 7,389,937 B2 | 6/2008 | Ito | |
| 7,405,471 B2 | 7/2008 | Kledzik et al. | |
| 7,414,312 B2 | 8/2008 | Nguyen et al. | |
| 7,476,975 B2 | 1/2009 | Ogata | |
| 7,518,226 B2 | 4/2009 | Cablao et al. | |
| 7,535,110 B2 | 5/2009 | Wu et al. | |
| 7,550,842 B2 | 6/2009 | Khandros et al. | |
| 7,589,409 B2 | 9/2009 | Gibson et al. | |
| 7,633,146 B2 | 12/2009 | Masuda et al. | |
| 7,633,147 B2 | 12/2009 | Funaba et al. | |
| 7,642,635 B2 | 1/2010 | Kikuchi et al. | |
| 7,692,931 B2 | 4/2010 | Chong et al. | |
| 7,763,964 B2 | 7/2010 | Matsushima | |
| 7,763,969 B2 | 7/2010 | Zeng et al. | |
| RE41,478 E | 8/2010 | Nakamura et al. | |
| RE41,721 E | 9/2010 | Nakamura et al. | |
| RE41,722 E | 9/2010 | Nakamura et al. | |
| 7,795,721 B2 | 9/2010 | Kurita | |
| RE41,972 E | 11/2010 | Lenander et al. | |
| 7,989,940 B2 | 8/2011 | Haba et al. | |
| 8,030,746 B2 * | 10/2011 | Tan | 257/686 |
| RE42,972 E | 11/2011 | Nakamura et al. | |
| 8,064,236 B2 * | 11/2011 | Nishio et al. | 365/51 |
| 8,115,269 B2 * | 2/2012 | Farnworth et al. | 257/458 |
| 8,138,015 B2 | 3/2012 | Joseph et al. | |
| 8,238,134 B2 * | 8/2012 | Matsui et al. | 365/63 |
| 8,345,441 B1 | 1/2013 | Crisp et al. | |
| 8,441,111 B2 | 5/2013 | Crisp et al. | |
| 8,502,390 B2 | 8/2013 | Crisp et al. | |
| 8,513,817 B2 | 8/2013 | Haba et al. | |
| 2001/0002727 A1 | 6/2001 | Shiraishi et al. | |
| 2001/0022740 A1 | 9/2001 | Nuxoll et al. | |
| 2001/0038106 A1 | 11/2001 | Coteus et al. | |
| 2002/0000583 A1 | 1/2002 | Kitsukawa et al. | |
| 2002/0016056 A1 | 2/2002 | Corisis | |
| 2002/0027019 A1 | 3/2002 | Hashimoto | |
| 2002/0030261 A1 | 3/2002 | Rolda et al. | |
| 2002/0053727 A1 | 5/2002 | Kimura | |
| 2002/0053732 A1 | 5/2002 | Iwaya et al. | |
| 2002/0066950 A1 | 6/2002 | Joshi | |
| 2002/0171142 A1 | 11/2002 | Kinsman | |
| 2003/0064547 A1 | 4/2003 | Akram et al. | |
| 2003/0089978 A1 | 5/2003 | Miyamoto et al. | |
| 2003/0089982 A1 | 5/2003 | Feurle | |
| 2003/0107908 A1 | 6/2003 | Jang et al. | |
| 2003/0205801 A1 | 11/2003 | Baik et al. | |
| 2003/0211660 A1 | 11/2003 | Lim et al. | |
| 2004/0016999 A1 | 1/2004 | Misumi | |
| 2004/0061211 A1 | 4/2004 | Michii et al. | |
| 2004/0061577 A1 | 4/2004 | Breisch et al. | |
| 2004/0090756 A1 | 5/2004 | Ho et al. | |
| 2004/0112088 A1 | 6/2004 | Ueda et al. | |
| 2004/0145042 A1 | 7/2004 | Morita et al. | |
| 2004/0164382 A1 | 8/2004 | Gerber et al. | |
| 2004/0184240 A1 | 9/2004 | Su | |
| 2005/0116358 A1 | 6/2005 | Haba | |
| 2005/0194672 A1 | 9/2005 | Gibson et al. | |
| 2005/0206585 A1 | 9/2005 | Stewart et al. | |
| 2005/0243590 A1 | 11/2005 | Lee et al. | |
| 2005/0258532 A1 | 11/2005 | Yoshikawa et al. | |
| 2005/0258538 A1 | 11/2005 | Gerber | |
| 2006/0004981 A1 | 1/2006 | Bains | |
| 2006/0081983 A1 | 4/2006 | Humpston et al. | |
| 2006/0207788 A1 | 9/2006 | Yoon et al. | |
| 2006/0290005 A1 | 12/2006 | Thomas et al. | |
| 2007/0025131 A1 | 2/2007 | Ruckerbauer et al. | |
| 2007/0108592 A1 | 5/2007 | Lai et al. | |
| 2007/0120238 A1 | 5/2007 | Vaiyapuri | |
| 2007/0120245 A1 | 5/2007 | Yoshikawa et al. | |
| 2007/0143553 A1 | 6/2007 | LaBerge | |
| 2007/0187836 A1 | 8/2007 | Lyne | |
| 2007/0241441 A1 | 10/2007 | Choi et al. | |
| 2007/0260841 A1 | 11/2007 | Hampel et al. | |
| 2008/0012110 A1 | 1/2008 | Chong et al. | |
| 2008/0036067 A1 | 2/2008 | Lin | |
| 2008/0048777 A1 | 2/2008 | Kohjiro et al. | |
| 2008/0061423 A1 | 3/2008 | Brox et al. | |
| 2008/0088033 A1 | 4/2008 | Humpston et al. | |
| 2008/0098277 A1 | 4/2008 | Hazelzet | |
| 2008/0136006 A1 | 6/2008 | Jang et al. | |
| 2008/0150155 A1 | 6/2008 | Periaman et al. | |
| 2008/0182443 A1 | 7/2008 | Beaman et al. | |
| 2008/0185705 A1 | 8/2008 | Osborn et al. | |
| 2008/0230888 A1 | 9/2008 | Sasaki | |
| 2008/0265397 A1 | 10/2008 | Lin et al. | |

(56) References Cited

U.S. PATENT DOCUMENTS

| | | | |
|---|---|---|---|
| 2009/0020885 A1* | 1/2009 | Onodera | 257/777 |
| 2009/0065948 A1 | 3/2009 | Wang | |
| 2009/0108425 A1 | 4/2009 | Lee et al. | |
| 2009/0200680 A1 | 8/2009 | Shinohara et al. | |
| 2009/0250255 A1 | 10/2009 | Shilling et al. | |
| 2009/0250822 A1 | 10/2009 | Chen et al. | |
| 2009/0294938 A1 | 12/2009 | Chen | |
| 2009/0314538 A1 | 12/2009 | Jomaa et al. | |
| 2010/0052111 A1 | 3/2010 | Urakawa | |
| 2010/0090326 A1 | 4/2010 | Baek et al. | |
| 2010/0102428 A1 | 4/2010 | Lee et al. | |
| 2010/0182040 A1 | 7/2010 | Feng et al. | |
| 2010/0244272 A1 | 9/2010 | Lee et al. | |
| 2010/0244278 A1 | 9/2010 | Shen | |
| 2010/0295166 A1 | 11/2010 | Kim | |
| 2010/0301466 A1 | 12/2010 | Taoka et al. | |
| 2010/0327457 A1 | 12/2010 | Mabuchi | |
| 2011/0042824 A1 | 2/2011 | Koide | |
| 2011/0193178 A1 | 8/2011 | Chang et al. | |
| 2011/0193226 A1 | 8/2011 | Kirby et al. | |
| 2011/0254156 A1 | 10/2011 | Lin | |
| 2012/0018863 A1 | 1/2012 | Oganesian et al. | |
| 2012/0020026 A1 | 1/2012 | Oganesian et al. | |
| 2012/0155049 A1 | 6/2012 | Haba et al. | |

FOREIGN PATENT DOCUMENTS

| | | | |
|---|---|---|---|
| JP | 2004-063767 A | 2/2004 | |
| JP | 2005251957 A | 9/2005 | |
| JP | 2008-198841 A | 8/2008 | |
| JP | 3143893 U | 8/2008 | |
| JP | 2010-098098 A | 4/2010 | |
| KR | 2001-0002214 A | 1/2001 | |
| KR | 2001-0081922 A | 8/2001 | |
| KR | 2005-0119414 A | 12/2005 | |
| KR | 2006-0120365 A | 11/2006 | |
| KR | 10-0690247 B1 | 2/2007 | |
| KR | 2007-0088177 A | 8/2007 | |
| KR | 2009-0008341 A | 1/2009 | |
| KR | 2009-0086314 A | 8/2009 | |
| KR | 2010-0041430 A | 4/2010 | |
| TW | M338433 U | 8/2008 | |
| WO | 2010120310 A1 | 10/2010 | |
| WO | 2013052080 A1 | 4/2013 | |
| WO | 2013052373 A1 | 4/2013 | |

OTHER PUBLICATIONS

U.S. Appl. No. 13/439,228, filed Apr. 4, 2012.
U.S. Appl. No. 13/439,273, filed Apr. 4, 2012.
U.S. Appl. No. 13/439,299, filed Apr. 4, 2012.
U.S. Appl. No. 13/439,354, filed Apr. 4, 2012.
U.S. Appl. No. 13/440,199, filed Apr. 5, 2012.
U.S. Appl. No. 13/440,280, filed Apr. 5, 2012.
U.S. Appl. No. 13/440,290, filed Apr. 5, 2012.
U.S. Appl. No. 13/440,299, filed Apr. 5, 2012.
U.S. Appl. No. 13/440,515, filed Apr. 5, 2012.
U.S. Appl. No. 13/306,068, filed Nov. 29, 2011.
U.S. Appl. No. 13/346,201, filed Jan. 9, 2012.
U.S. Appl. No. 13/354,747, filed Jan. 20, 2012.
U.S. Appl. No. 13/354,772, filed Jan. 20, 2012.
U.S. Appl. No. 13/439,286, filed Apr. 5, 2012.
U.S. Appl. No. 13/439,317, filed Apr. 5, 2012.
U.S. Appl. No. 13/440,212, filed Apr. 5, 2012.
U.S. Appl. No. 13/440,313, filed Apr. 5, 2012.
US Non Final Office Action dated Oct. 18, 2012 for U.S. Appl. No. 13/439,299.
US Non-Final Office Action for U.S. Appl. No. 13/440,199 dated Aug. 31, 2012.
US Non-Final Office Action for U.S. Appl. No. 13/440,280 dated Aug. 31, 2012.
International Search Report and Written Opinion for Application No. PCT/US2014/061915 dated Mar. 4, 2015.
Asinash Roy et al: "Effects of Coupling Capacitance and Inductance on Delay Uncertainty and Clock Skew", 2007 44th ACM/IEEE Design Automation Conference , San Diego, CA, Jun. 4-8, 2007, IEEE, Pi Scataway, NJ , Jun. 1, 2007, pp. 184-187, XP031183328.
Elpida User's Manual, "Introduction to GDDR5 SGRAM", Document No. E1600E10 (Ver. 1.0), Published Mar. 2010, Japan, URL: http:'www.elpida.com.
Hynix, "2GB (64Mx32) GDDR5 SGRAM HRGQ2H24AFR", Nov. 2011-Feb. 2012.
International Search Report and Written Opinion dated Mar. 21, 2013 for Application No. PCT/US2012/000425.
International Search Report and Written Opinion dated Mar. 21, 2013 for Application No. PCT/US2012/057911.
International Search Report and Written Opinion for Application No. PCT/US2012/046049 dated Jan. 10, 2013.
International Search Report and Written Opinion for Application No. PCT/US2012/046049 dated Nov. 29, 2012.
International Search Report and Written Opinion for Application No. PCT/US2012/046249 dated Mar. 20, 2013.
International Search Report and Written Opinion for Application No. PCT/US2012/046255 dated Mar. 20, 2013.
International Search Report and Written Opinion for Application No. PCT/US2012/057170 dated Mar. 22, 2013.
International Search Report and Written Opinion for Application No. PCT/US2012/057179 dated Apr. 4, 2013.
International Search Report and Written Opinion for Application No. PCT/US2012/057200 dated Mar. 1, 2013.
International Search Report and Written Opinion for Application No. PCT/US2012/057204 dated Aug. 30, 2013.
International Search Report and Written Opinion for Application No. PCT/US2012/057554 dated Feb. 28, 2013.
International Search Report and Written Opinion for Application No. PCT/US2012/057563 dated Mar. 5, 2013.
International Search Report and Written Opinion for Application No. PCT/US2012/057810 dated Jul. 23, 2013.
International Search Report and Written Opinion for Application No. PCT/US2012/058273 dated Mar. 6, 2013.
International Search Report and Written Opinion for Application No. PCT/US2012/058398 dated Jul. 4, 2013.
International Search Report and Written Opinion for Application No. PCT/US2012/058407 dated Mar. 28, 2013.
International Search Report and Written Opinion for Application No. PCT/US2012/058423 dated Mar. 20, 2013.
International Search Report and Written Opinion for Application No. PCT/US2012/058434 dated Jun. 21, 2013.
International Search Report and Written Opinion for Application No. PCT/US2012/058557 dated Mar. 12, 2013.
International Search Report and Written Opinion for Application No. PCT/US2013/056773 dated Dec. 4, 2013.
International Search Report and Written Opinion for Application No. PCT/US2012/057895 dated Jun. 10, 2013.
International Search Report and Written Opinion for Application No. PCT/US2012/058229 dated Jul. 3, 2013.
International Search Report Application No. PCT/US2011/031391, dated Dec. 12, 2011.
International Search Report for Application No. PCT/US2012/057173 dated Aug. 5, 2013.
International Search Report for Application No. PCT/US2012/057905 dated Aug. 20, 2013.
Kang, et al., 8Gb 3D DDR3 DRAM Using Through-Silicon-Via Technology, IEEE, International Solid-State Circuits Conference, 2009, pp. 130-132.
Kang, et al., 8Gb 3D DDR3 DRAM Using Through-Silicon-Via Technology, IEEE, International Solid-State Circuits Conference, 2009, Samsung Electronics, Hwasung, Korea.
Office Action from Korean Patent Application No. 10-2010-0129890 dated Jan. 18, 2011.
Partial International Search Report Application No. PCT/US2011/031391, dated Aug. 25, 2011.
Partial International Search Report dated Oct. 12, 2012 in International Patent Appl. No. PCT/US2012/046249.
Partial International Search Report dated Oct. 12, 2012 in International Patent Appl. No. PCT/US2012/046255.

(56) References Cited

OTHER PUBLICATIONS

Partial International Search Report dated Oct. 26, 2012 in International Patent Appl. No. PCT/US2012/046049.
Partial Search Report for Application No. PCT/US2012/000425 dated Jan. 30, 2013.
Partial Search Report for Application No. PCT/US2012/057170 dated Jan. 31, 2013.
Partial Search Report for Application No. PCT/US2012/057554 dated Jan. 24, 2013.
Partial Search Report for Application No. PCT/US2012/058273 dated Jan. 24, 2013.
Partial Search Report for Application No. PCT/US2012/058557 dated Feb. 4, 2013.
Sandforce, "SF-2200 & SF-2100 Client SSD Processors", 2011.
Search Report from Korean Patent Application No. 10-2010-0129890 dated Jan. 18, 2011.
US Amendment for U.S. Appl. No. 13/439,299 dated Jan. 18, 2013.
US Amendment for U.S. Appl. No. 13/440,199 dated Nov. 30, 2012.
US Amendment for U.S. Appl. No. 13/440,280 dated Nov. 30, 2012.
U.S. Appl. No. 13/080,876, filed Apr. 6, 2011.
U.S. Appl. No. 13/306,300, filed Nov. 29, 2011.
U.S. Appl. No. 13/337,565, filed Dec. 27, 2011.
U.S. Appl. No. 13/337,575, filed Dec. 27, 2011.

* cited by examiner

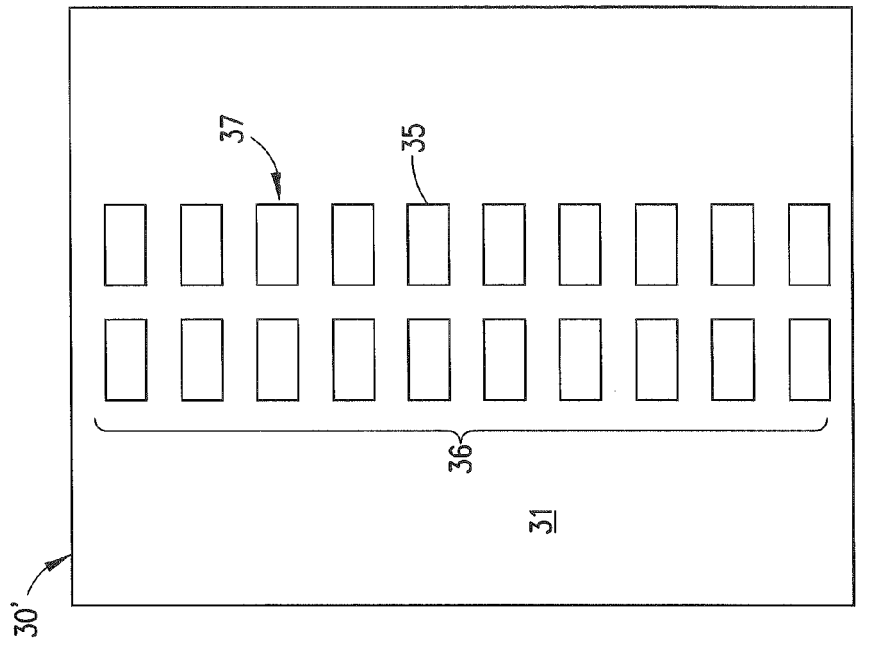
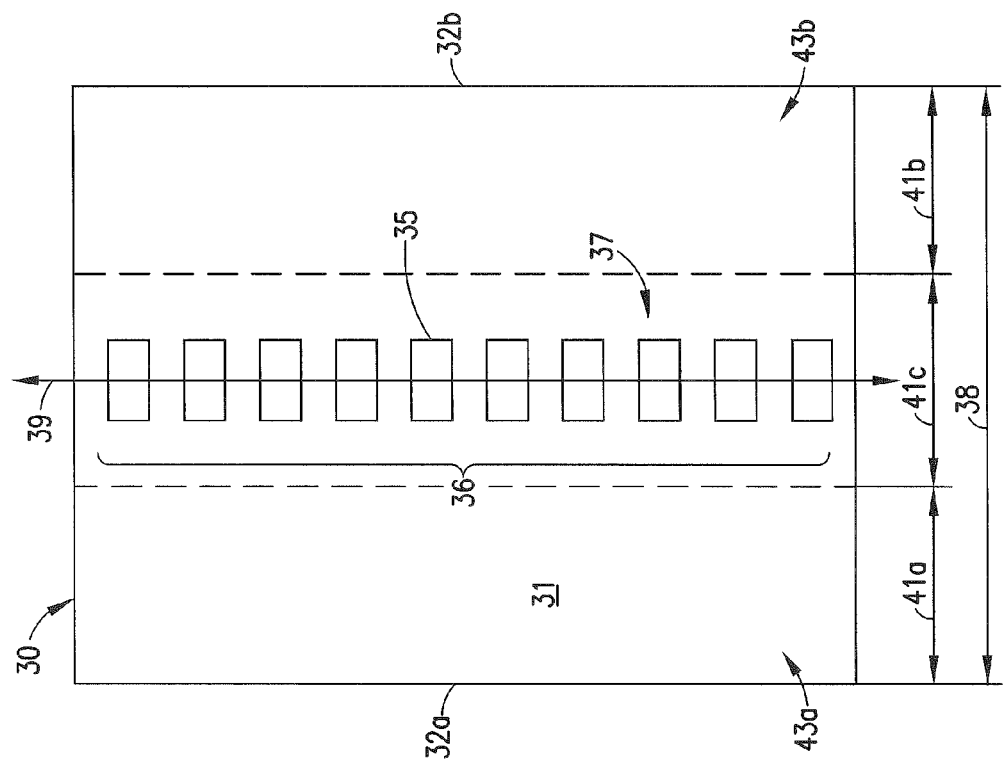

CO-SUPPORT FOR XFD PACKAGING

BACKGROUND OF THE INVENTION

The subject matter of the present application relates to microelectronic packages and assemblies incorporating microelectronic packages.

Semiconductor chips are commonly provided as individual, prepackaged units. A standard chip has a flat, rectangular body with a large front face having contacts connected to the internal circuitry of the chip. Each individual chip typically is contained in a package having external terminals connected to the contacts of the chip. In turn, the terminals, i.e., the external connection points of the package, are configured to electrically connect to a circuit panel, such as a printed circuit board. In many conventional designs, the chip package occupies an area of the circuit panel considerably larger than the area of the chip itself. As used in this disclosure with reference to a flat chip having a front face, the "area of the chip" should be understood as referring to the area of the front face.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components which form the interconnections should not greatly increase the size of the assembly. Similar needs arise in other applications as, for example, in data servers such as those used in internet search engines where increased performance and size reduction are needed.

Semiconductor chips containing memory storage arrays, particularly dynamic random access memory chips (DRAMs) and flash memory chips are commonly packaged in single- or multiple-chip packages and assemblies. Each package has many electrical connections for carrying signals, power and ground between terminals and the chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds which extend in both horizontal and vertical directions relative to the surface of the chip.

Conventional microelectronic packages can incorporate a microelectronic element which is configured to predominantly provide memory storage array function, i.e., a microelectronic element that embodies a greater number of active devices to provide memory storage array function than any other function. The microelectronic element may be or include a DRAM chip, or a stacked electrically interconnected assembly of such semiconductor chips. Typically, all of the terminals of such package are placed in sets of columns adjacent to one or more peripheral edges of a package substrate to which the microelectronic element is mounted. [Change to "112"—later—to match text] For example, in one conventional microelectronic package 12 seen in FIG. 1, three columns 14 of terminals can be disposed adjacent a first peripheral edge 16 of the package substrate 20 and three other columns 18 of terminals can be disposed adjacent a second peripheral edge 22 of the package substrate 20. A central region 24 of the package substrate 20 in the conventional package does not have any columns of terminals. FIG. 1 further shows a semiconductor chip 11 within the package having element contacts 26 on a face 28 thereof which are electrically interconnected with the columns 14, 18 of terminals of the package 12 through wire bonds 30 extending through an aperture, e.g., bond window, in the central region 24 of package substrate 20. In some cases, an adhesive layer 32 may be disposed between the face 28 of the microelectronic element 11 and the substrate 20 to reinforce the mechanical connection between the microelectronic element and the substrate, with the wire bonds extending through an opening in the adhesive layer 32.

Conventional circuit panels or other microelectronic components are typically configured to be coupled to a microelectronic package having one or more first type microelectronic elements therein. Such circuit panels or other microelectronic components typically cannot be coupled to a microelectronic package having one or more microelectronic elements therein that are of a different or second type.

In light of the foregoing, certain improvements in the design of circuit panels or other microelectronic components can be made in order to improve the functional flexibility or electrical performance thereof, particularly in circuit panels or other microelectronic components to which packages can be mounted and electrically interconnected with one another.

BRIEF SUMMARY OF THE INVENTION

An aspect of the invention provides microelectronic package. The package can have a dielectric element having first and second oppositely facing surfaces, and having first and second spaced apart apertures each extending between the first and second surfaces. A first microelectronic element may have a front face facing the first surface, a rear face facing away from the first surface and an edge extending between the front and rear faces, the first microelectronic element having contacts exposed at the front face. A second microelectronic element may have a front face partially overlying the rear face of the first microelectronic element and facing the first surface, the second microelectronic element having contacts disposed in a central region of its front face, the contacts disposed beyond the edge of the first microelectronic element. The dielectric element may have terminals at the second surface, the contacts of the first microelectronic element overlying the first aperture and electrically coupled with the terminals, and the contacts of the second microelectronic element overlying the second aperture and electrically coupled with the terminals. The terminals may include a plurality of first terminals between the first and second apertures configured to carry all data signals for read and write access to random access addressable memory locations of memory storage arrays within the first and second microelectronic elements.

In accordance with one or more examples, the first and second microelectronic elements can be of type DDRx.

In accordance with one or more examples, the dielectric element may have first and second parallel edges extending between the first and second surfaces, a first region of the second surface disposed between the first aperture and the first edge, a second region of the second surface being disposed between the second aperture and the second edge, wherein the terminals include second terminals including at least some second terminals having address information signal assignments for specifying each individual addressable memory location within the memory storage arrays, wherein all of the second terminals are disposed at locations within at least one of the first and second regions.

In accordance with one or more examples, the second terminals can be disposed at locations within each of the first and second regions, wherein the signal assignments of the at least some second terminals in the first region are symmetric about a theoretical axis extending parallel to the first and second edges of the dielectric element with the signal assignments of the at least some second terminals in the second region.

In accordance with one or more examples, the second terminals in each of the first and second regions may include at least some second terminals having command information signal assignments, and the signal assignments of the at least some second terminals having command information signal assignments in the first region are symmetric about the theoretical axis with the signal assignments of the at least some second terminals having command information signal assignments in the second region.

In accordance with one or more examples, the second terminals in the first region can be coupled with the contacts of the first microelectronic element and are not coupled with the contacts of the second microelectronic element, and the second terminals in the second region are coupled with the contacts of the second microelectronic element and are not coupled with the contacts of the first microelectronic element.

In accordance with one or more examples, the first and second microelectronic elements can be configured to receive the data signals simultaneously at the first and second microelectronic elements and are configured to output the data signals simultaneously from the first and second microelectronic elements.

In accordance with one or more examples, the first and second microelectronic elements can be of type LPDDRx.

In accordance with one or more examples, the dielectric element can have first and second parallel edges extending between the first and second surfaces, a first region of the second surface disposed between the first aperture and the first edge, a second region of the second surface being disposed between the second aperture and the second edge, wherein the terminals include second terminals configured to carry address information for specifying each individual addressable memory location within the memory storage arrays, wherein all of the second terminals are disposed at locations within at least one of the first and second regions.

In accordance with one or more examples, each of the first and second microelectronic elements can have first contacts at the respective front face, and the contacts of the first microelectronic element and the contacts of the second microelectronic elements are redistribution contacts which are electrically coupled with the first contacts on the respective microelectronic element through redistribution traces extending along the front faces of the first and second microelectronic elements.

In accordance with one or more examples, the edge of the first microelectronic element can be a first edge, the first microelectronic element has a second edge opposite the first edge thereof, and the first contacts of the first microelectronic element are disposed adjacent to the first and second edges thereof, and the first contacts of the second microelectronic element are disposed adjacent to the first and second edges thereof.

In accordance with one or more examples, the second terminals can be disposed at locations within each of the first and second regions, wherein signal assignments of the second terminals in the first region are symmetric about the theoretical axis with the signal assignments of the second terminals in the second region.

In accordance with one or more examples, the second terminals in each of the first and second regions can include at least some second terminals having command information signal assignments, and the signal assignments of the at least some second terminals having command information signal assignments in the first region are symmetric about the theoretical axis with the signal assignments of the at least some second terminals having command information signal assignments in the second region.

In accordance with one or more examples, the first terminals can include a first group thereof disposed on a first side of a theoretical plane and a second group thereof disposed on a second side of the theoretical plane opposite from the first side, wherein the first terminals of the first group have modulo-X symmetry about the theoretical plane with the second group of the first terminals, X being a multiple of 8 and a whole number of at least one. In accordance with one or more examples, X can be a number $2^n$ (2 to the power of n), wherein n is greater than or equal to 2.

In accordance with one or more examples, the microelectronic package can include leads extending through the apertures, the contacts being coupled with the terminals via the leads.

In accordance with one or more examples, the leads can include first leads extending through the first aperture to the contacts of the first microelectronic element and second leads extending through the second aperture to the contacts of the second microelectronic element.

In accordance with one or more examples, the dielectric element can include bond pads exposed at the second surface and electrically coupled with the terminals, and the leads include wire bonds extending through the apertures from the contacts to the bond pads.

In accordance with one or more examples, the leads can have portions overlying the apertures, the contacts being coupled with the terminals through the leads.

In accordance with one or more examples, the first and second apertures can be elongated in a same direction, the same direction parallel to the edge of the first microelectronic element.

A microelectronic assembly according to an aspect of the invention can include a circuit panel having first and second oppositely facing surfaces, first panel contacts at the first surface, and second panel contacts at the second surface, respectively. First and second microelectronic packages can be provided each having terminals mounted to the respective panel contacts. Each microelectronic package may include a dielectric element having first and second oppositely facing surfaces, and having first and second spaced apart apertures each extending between the first and second surfaces. A first microelectronic element can have a front face facing the first surface of the dielectric element, a rear face facing away from the first surface and an edge extending between the front and rear faces, the first microelectronic element having contacts exposed at the front face. A second microelectronic element can have a front face partially overlying the rear face of the first microelectronic element and facing the first surface of the dielectric element, a rear face facing away therefrom and first and second opposite edges each of the edges extending between the front and rear faces of the second microelectronic element. The second microelectronic element can have contacts disposed in a central region of the front face occupying a middle third of a distance between the first and second opposite edges the contacts. The dielectric element of each the package can have terminals at the second surface, wherein in each the package the contacts of the first microelectronic element overlie the first aperture and are electrically coupled with the terminals, and the contacts of the second microelectronic element overlie the second aperture and are electrically coupled with the terminals. In each such package the terminals may include a plurality of first terminals between the first and second apertures, the first terminals configured to carry all data signals for read and write access to random access addressable memory locations of memory storage arrays within the first and second microelectronic elements.

In accordance with one or more examples, the first terminals may include a first group thereof disposed on a first side of a theoretical plane and a second group thereof disposed on a second side of the theoretical plane opposite from the first side, wherein the first terminals of the first group have modulo-X symmetry about the theoretical plane with the second group of the first terminals.

In accordance with one or more examples, the first terminals of the first microelectronic package may be coupled through the circuit panel with the first terminals of the second microelectronic package, and the first terminals of the first microelectronic package can be aligned within one ball pitch in x and y orthogonal directions parallel to the first and second surfaces of the circuit panel with the corresponding first terminals of the second microelectronic package to which they are coupled.

In accordance with one or more examples, the first terminals of the first microelectronic package can have signal assignments which are modulo-X equivalent with the corresponding first terminals of the second microelectronic package to which they are coupled through the circuit panel.

In accordance with one or more examples, the second terminals in the first region of the first microelectronic package can be coupled through the circuit panel with the second terminals in the second region of the second microelectronic package, and the second terminals of the first region of the first microelectronic package are aligned within one ball pitch in either one or both of x and y orthogonal directions parallel to the first and second surfaces of the circuit panel with the corresponding second terminals of the second region of the second microelectronic package to which they are coupled.

In accordance with one or more examples, second terminals in the second group of second terminals of the first microelectronic package and second terminals in the first group of second terminals of the second microelectronic package can be aligned with one another in the x and y orthogonal directions such that the second terminals of the second group of the first microelectronic package and the second terminals of the first group of the second microelectronic package are coincident with one another.

In accordance with one or more examples, at least some of the electrical connections through the circuit panel between the first terminals of the first microelectronic package and the first terminals of the second microelectronic package can have an electrical length of approximately a thickness of the circuit panel.

In accordance with one or more examples, the total combined length of conductive elements connecting a pair of electrically coupled first and second panel contacts exposed at the first and second surfaces of the circuit panel can be less than seven times a smallest pitch of the panel contacts.

In accordance with one or more examples, the circuit panel can include a bus having a plurality of conductors configured to carry all of the address information transferred to each of the microelectronic packages. The conductors can extend in a first direction parallel to the first and second surfaces, wherein there is no more than one routing layer for global routing of all of the address information between a connection site on the circuit panel at which the first terminals of the first and second microelectronic packages are electrically connected and a different connection site on the circuit panel at which the first terminals of at least a third microelectronic package are electrically connected.

In one embodiment, a package can include a first microelectronic element and having a front face facing a first surface of a dielectric element, and a second microelectronic element having a front face facing a rear surface of the first microelectronic element and facing towards the first surface of the dielectric element. The terminals of the package can include first terminals that are disposed at a central region of the second surface of the dielectric element that faces away from the microelectronic assembly, the first terminals configured to carry all of the data signals transferred to and from the package for read access and for write access to random access addressable memory storage locations of memory storage arrays within the first and second microelectronic elements. For example, the first terminals can include terminals used for carrying uni-directional or bi-directional data signals to and/or from the first and second microelectronic elements, and data strobe signals, as well as data masks and ODT or "on die termination" signals used to turn on or off parallel terminations to termination resistors. In one embodiment, terminals configured to carry signals or reference potentials such as chip select, reset, power supply voltages, e.g., Vdd, Vddq, and ground, e.g., Vss and Vssq, can also be disposed within the central region of the dielectric element second surface. In one example, the central region may be such that it is not wider than three and one-half times a minimum pitch between adjacent ones of parallel columns of the terminals. The central region can be disposed between first and second apertures which overlie contacts of the first microelectronic element and of the second microelectronic element, respectively.

In some embodiments, the microelectronic package may have no more than four columns of the first terminals in the central region configured to carry all of the above-noted data signals described above. In certain embodiments, there may be only two columns of such terminals. In other embodiments there may only be one column of such terminals. As will be further described below, in some embodiments, each first terminal assigned to carry a data signal can be electrically coupled with a corresponding contact on a microelectronic element included in the package. Alternatively, each such first terminal can be electrically coupled with a contact on more than one microelectronic element included in the microelectronic package. As will be further described below with respect to FIG. 6, in a particular example, the signal assignments of first terminals can have modulo-X symmetry.

In one embodiment, second terminals can be disposed within peripheral regions of the second surface, a first peripheral region disposed between the first aperture and the first peripheral edge, and a second peripheral region disposed between the second aperture and the second peripheral edge of the dielectric element. In certain embodiments of the invention, the second terminals can be configured to carry address information for specifying each individual addressable memory location within the memory storage arrays, and all of the second terminals can be disposed at locations within at least one of the first and second regions.

BRIEF DESCRIPTION OF THE SEVERAL VIEWS OF THE DRAWINGS

FIG. 5C is a diagrammatic plan view of one of the microelectronic elements shown in FIG. 5A.

FIG. 5D is a diagrammatic plan view of an alternate embodiment of one of the microelectronic elements shown in FIG. 5A.

FIG. 5I is a plan view of a microelectronic element comprised in some embodiments of the invention.

DETAILED DESCRIPTION

Figure 1:
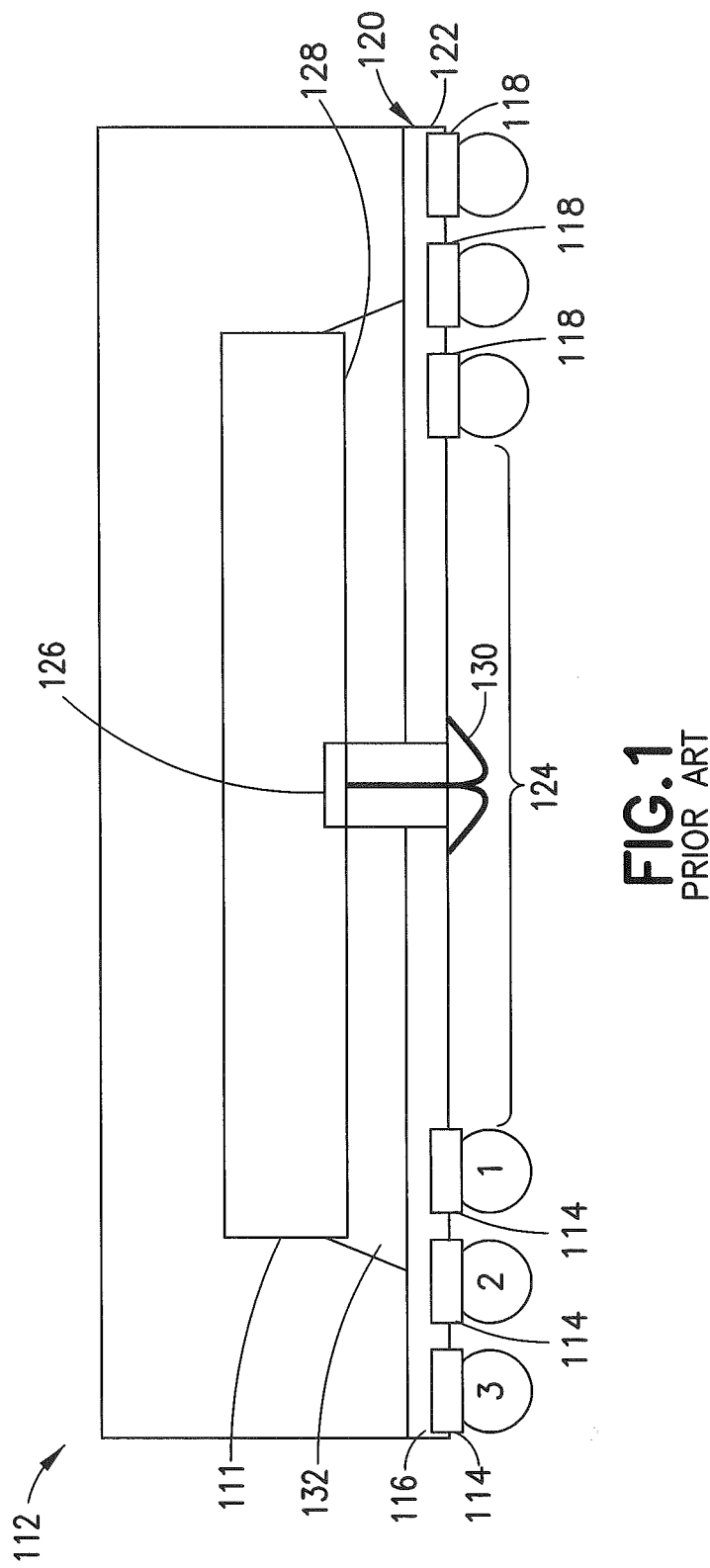
FIG. 1 is a side sectional view of a prior art microelectronic package.

In view of the illustrative conventional microelectronic package 112 described relative to FIG. 1, the inventors have recognized improvements which can be made that may help improve the electrical performance of a microelectronic package incorporating a memory storage array chip, and a microelectronic assembly that incorporates such microelectronic package.

Embodiments of the invention herein provide packages that have more than one semiconductor chip, i.e., a microelectronic element therein. A multiple chip package can reduce the amount of area or space required to connect the chips therein to a circuit panel, e.g., printed wiring board to which the package may be electrically and mechanically connected through an array of terminals, such as a ball grid array, land grid array or pin grid array, among others. Such connection space is particularly limited in small or portable computing devices, e.g., handheld devices such as "smartphones" or tablets that typically combine the function of personal computers with wireless connectivity to the broader world. Multichip packages can be particularly useful for making large amounts of relatively inexpensive memory available to a system, such as advanced high performance dynamic random access memory ("DRAM") chips, e.g., in DDR3 type DRAM chips and its follow-ons.

The amount of area of the circuit panel needed to connect the multi-chip package thereto can be reduced by providing common terminals on the package through which at least some signals travel on their way to or from two or more chips within the package. However, doing so in a way that supports high performance operation presents challenges. To avoid undesirable effects such as undesirable reflections of the signal due to unterminated stubs, the traces, vias, and other conductors on a circuit panel that electrically connect the terminals at the exterior of the package with the global wiring on the circuit panel such as the bus 136 (FIG. 2) must not be too long. Heat dissipation also presents a challenge for advanced chips, such that it is desirable for at least one of the large flat surfaces of each chip to be coupled to a heat spreader or be exposed to or in thermal communication with a flow or air within an installed system. The packages described below can help to further these goals.

Figure 2:
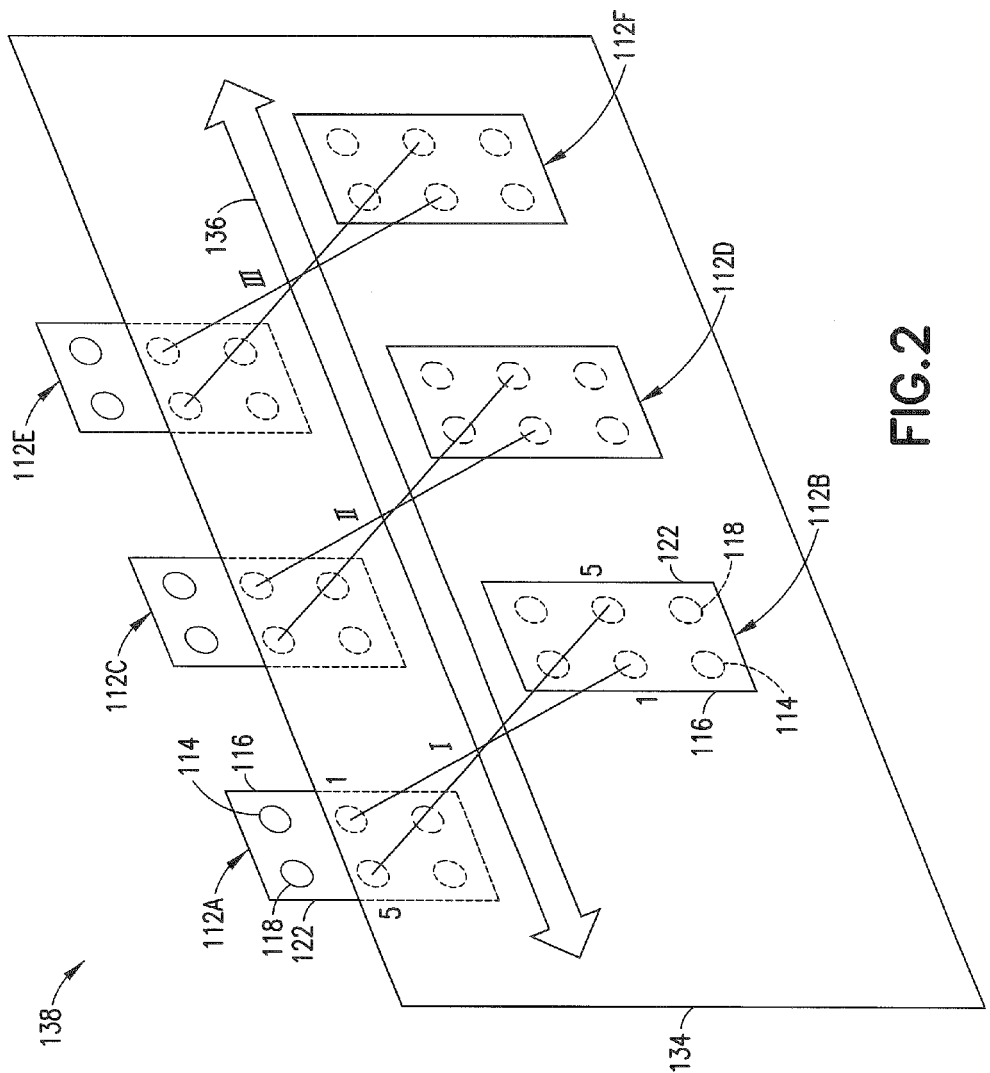
FIG. 2 is a diagrammatic perspective view of a microelectronic assembly showing electrical connections between terminals of the microelectronic packages.
Figure 3:
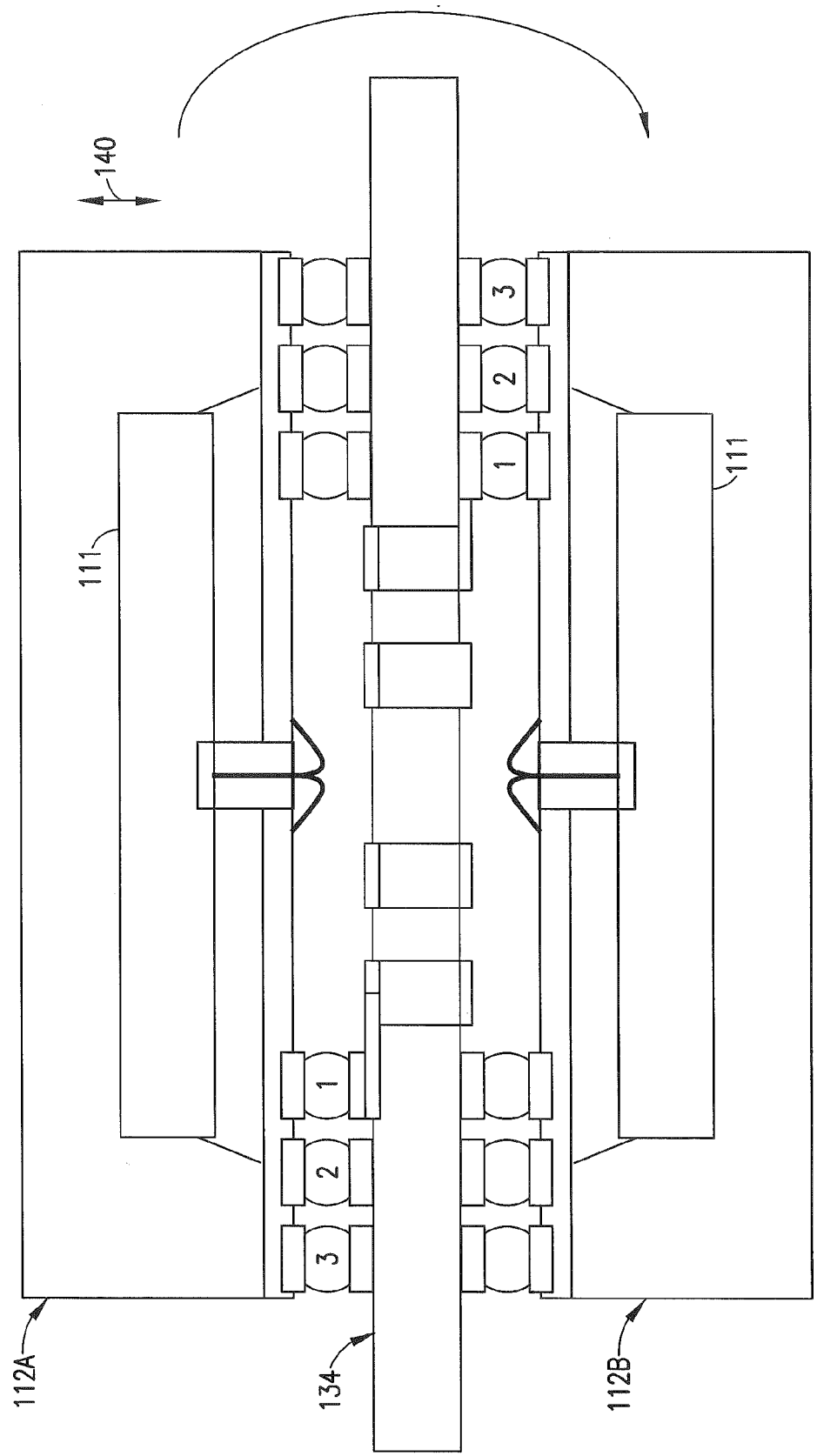
FIG. 3 is a side sectional view of the microelectronic assembly of FIG. 2.
Figure 4:
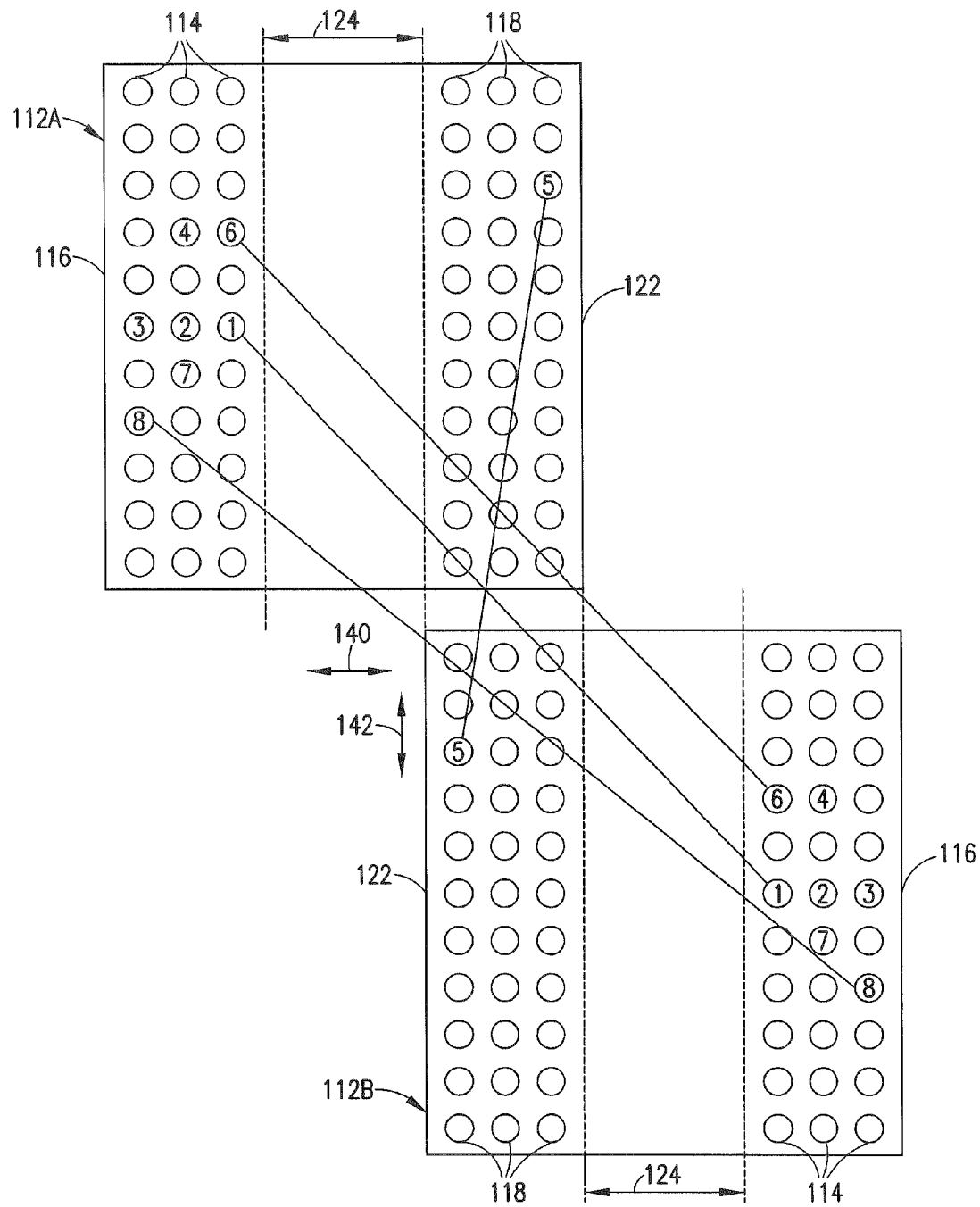
FIG. 4 diagrammatic bottom plan view of the electrical connections between terminals of the microelectronic packages of FIG. 3.

In one example, improvements can be made in a microelectronic package which can be used in an assembly such as shown in FIGS. 2-4, in which a package 112A is mounted to a surface of a circuit panel with another like package 112B mounted opposite thereto on an opposite surface of the circuit panel. The packages 112A, 112B typically are functionally and mechanically equivalent to one another. Other pairs 112C and 112D; and 112E and 112F, of functionally and mechanically equivalent packages typically are also mounted to the same circuit panel 134. The circuit panel and the packages assembled thereto may form a portion of an assembly commonly referred to as a dual in-line memory module ("DIMM"). The packages in each oppositely mounted pair of packages, e.g., packages 112A, 112B, connect to contacts on opposite surfaces of the circuit panel so that the packages in each pair overlie one another typically by more than 90% of their respective areas. Local wiring within the circuit panel 134 connects terminals, e.g., the terminals labeled "1" and "5" on each package to global wiring on the circuit panel. The global wiring includes the signal conductors of a bus 136 used to conduct some signals to connection sites on the circuit panel 134 such as sites I, II and III. For example, the packages 112A, 112B are electrically connected to the bus 136 by local wiring coupled to a connection site I, the packages 112C, 112D are electrically connected to the bus by local wiring coupled to connection site II, and the packages 112E, 112F are electrically connected to the bus by local wiring coupled to connection site III.

The circuit panel 134 electrically interconnects the terminals of the respective packages 112A, 112B using local interconnect wiring that appears similar to a crisscross or "shoelace" pattern in which a terminal labeled "1" near one edge 116 of package 112A connects through the circuit panel 134 to a terminal labeled "1" of package 112B near the same edge 116 of package 112B. However, the edge 116 of the package 112B as assembled to the circuit panel 134 is far from the edge 116 of the package 112A. FIGS. 2-4 further show that a terminal labeled "5" near an edge 122 of the package 112A is connected through the circuit panel 134 to a terminal labeled "5" of the package 112B near the same edge 122 of the package 112B. In the assembly 138, the edge 122 of the package 112A is far from the edge 122 of the package 112B.

Connections through the circuit panel between terminals on each package, e.g., the package 112A, to the corresponding terminals on the package mounted opposite thereto, i.e., the package 112B, are fairly long. As further seen in FIG. 3, in such assembly of like microelectronic packages 112A, 112B, the circuit panel 134 may electrically interconnect a signal conductor of the bus 136 with the terminal of the package 112A marked "1" and the corresponding terminal of the package 112B marked "1", when the same signal from the bus is to be transmitted to each package. Similarly, the circuit panel 134 may electrically interconnect another signal conductor of the bus 136 with the terminal of the package 112A marked "2" and the corresponding terminal of the package 112B marked "2". The same connection arrangement may also apply to other signal conductors of the bus and corresponding terminals of each package.

Local wiring between the bus 136 on the circuit panel 134 and each package of the respective pair of packages, e.g., the packages 112A, 112B (FIG. 2) at a connection site I of the board can be in form of unterminated stubs. Such local wiring, when relatively long, may in some cases impact the performance of the assembly 138 as discussed below. Moreover, the circuit panel 134 also requires local wiring to electrically interconnect certain terminals of other packages: the pair of packages 112C and 112D and the pair of packages 112E and 112F to the global wiring of the bus 136, and such wiring can also impact the performance of the assembly in the same way.

FIG. 4 further illustrates the interconnection between the microelectronic packages 112A, 112B of respective pairs of terminals assigned to carry signals "1", "2", "3", "4", "5", "6", "7", and "8". As seen in FIG. 4, columns 114 of terminals are disposed near an edge 116 of each package which extends in a direction 142. Columns 118 of terminals are exposed near an opposite edge 122 of each package. Because like terminals of the two packages 112A, 112B as used together in assembly 138 are disposed near opposite edges as seen in FIG. 2, wiring must traverse the circuit panel 134 in a "shoelace pattern" in a direction 140 transverse to direction 142 in which the columns 114, 118 extend. Such wiring can be quite long. In recognition that the length of a DRAM chip can be in the range of ten millimeters on each side, the length of the local wiring in a circuit panel 134 in an assembly 138 seen in FIGS. 2-4 required for some signals to route the same signal to the corresponding terminals of two oppositely mounted packages 112A, 112B can range between five and ten millimeters and may typically be about seven millimeters.

In some cases, relatively long unterminated wiring on a circuit panel that connects the terminals of a package may not severely impact the electrical performance of the assembly 138. However, when a signal is transferred from a bus 136 of the circuit panel to each of multiple pairs of packages connected to the circuit panel as shown in FIG. 2, the inventors recognize that the electrical lengths of the stubs, i.e., the local wiring, that extend from the bus 136 to the terminal connected thereto on each package potentially impacts the performance of the assembly 138. Signal reflections on the unterminated stubs can travel in the reverse direction from the connected terminals of each package back onto the bus 136, and thus degrade the signals being transferred from the bus to the packages. The impacts may be tolerable for some packages containing microelectronic elements of current manufacture. However, in present or future assemblies that operate with increased signal switching frequencies, low voltage swing signals, or both, the inventors recognize that the impacts can become severe. For these assemblies, settling time, ringing, jitter, or intersymbol interference of a transmitted signal may increase to an unacceptable degree.

The inventors further recognize that the electrical lengths of the unterminated stubs are usually longer than the local wiring that connects the bus 136 on the circuit panel with the terminals of the packages mounted thereto. Unterminated wiring within each package from the package terminals to the semiconductor chip therein adds to the lengths of the stubs.

In a specific example, the bus 136 is a command-address bus of an assembly having a predominant memory storage array function such as a DIMM. The command-address bus 136 can be configured to carry address information transferred to the microelectronic packages that is usable by circuitry within the packages, e.g., row address and column address decoders, and bank selection circuitry, if present, to determine an addressable memory location from among all the available addressable memory locations of a memory storage array within a microelectronic element in the microelectronic packages. The command-address bus 136 can be configured to carry the above-noted address information to connection sites, e.g., sites I, II, and III shown in FIG. 2. This above-noted address information can then be distributed by local wiring to respective sets of panel contacts on opposite surfaces of the circuit panel, to which packages 112A, 112B, 112C, 112D, 112E, and 112F are connected.

In a particular example, when the microelectronic element is or includes a DRAM chip, the command-address bus 136 can be configured to carry all of a group of signals of a command-address bus of the microelectronic element, i.e., command signals, address signals, bank address signals, and clock signals that are transferred to the microelectronic packages, wherein the command signals include write enable, row address strobe, and column address strobe signals, and the clock signals are clocks used for sampling the address signals. While the clock signals can be of various types, in one embodiment, the clock signals carried by these terminals can be one or more pairs of differential clock signals received as differential or true and complement clock signals.

Accordingly, certain embodiments of the invention described herein provide a microelectronic package configured so as to permit the lengths of stubs to be reduced when first and second such packages are mounted opposite one another on opposite surfaces of a circuit panel, e.g., a circuit board, module board or card, or flexible circuit panel. Assemblies that incorporate first and second microelectronic packages mounted opposite one another on a circuit panel can have significantly reduced stub lengths between the respective packages. The reductions in the lengths of these electrical connections can reduce stub lengths in the circuit panel and the assembly, which can help improve the electrical performance, such as reducing settling time, ringing, jitter, or intersymbol interference, among others, for the above-noted signals which are carried by the first terminals and which are transferred to microelectronic elements in both the first and second packages. Moreover, it may be possible to obtain other benefits as well, such as simplifying the structure of the circuit panel or reducing the complexity and cost of designing or manufacturing the circuit panel.

Certain embodiments of the invention provide a package or microelectronic assembly in which a microelectronic element, e.g., a semiconductor chip, or stacked arrangement of semiconductor chips, has a memory storage array function. The microelectronic element can be configured to predominantly provide a memory storage array function. In such microelectronic element, the number of active devices, e.g., transistors, therein that are configured, i.e., constructed and interconnected with other devices, to provide the memory storage array function, is greater than the number of active devices that are configured to provide any other function. Thus, in one example, a microelectronic element such as a DRAM chip may have memory storage array function as its primary or sole function. Alternatively, in another example, such microelectronic element may have mixed use and may incorporate active devices configured to provide memory storage array function, and may also incorporate other active devices configured to provide another function such as processor function, or signal processor or graphics processor function, among others. In this case, the microelectronic element may still have a greater number of active devices configured to provide the memory storage array function than any other function of the microelectronic element.

Figure 5A:
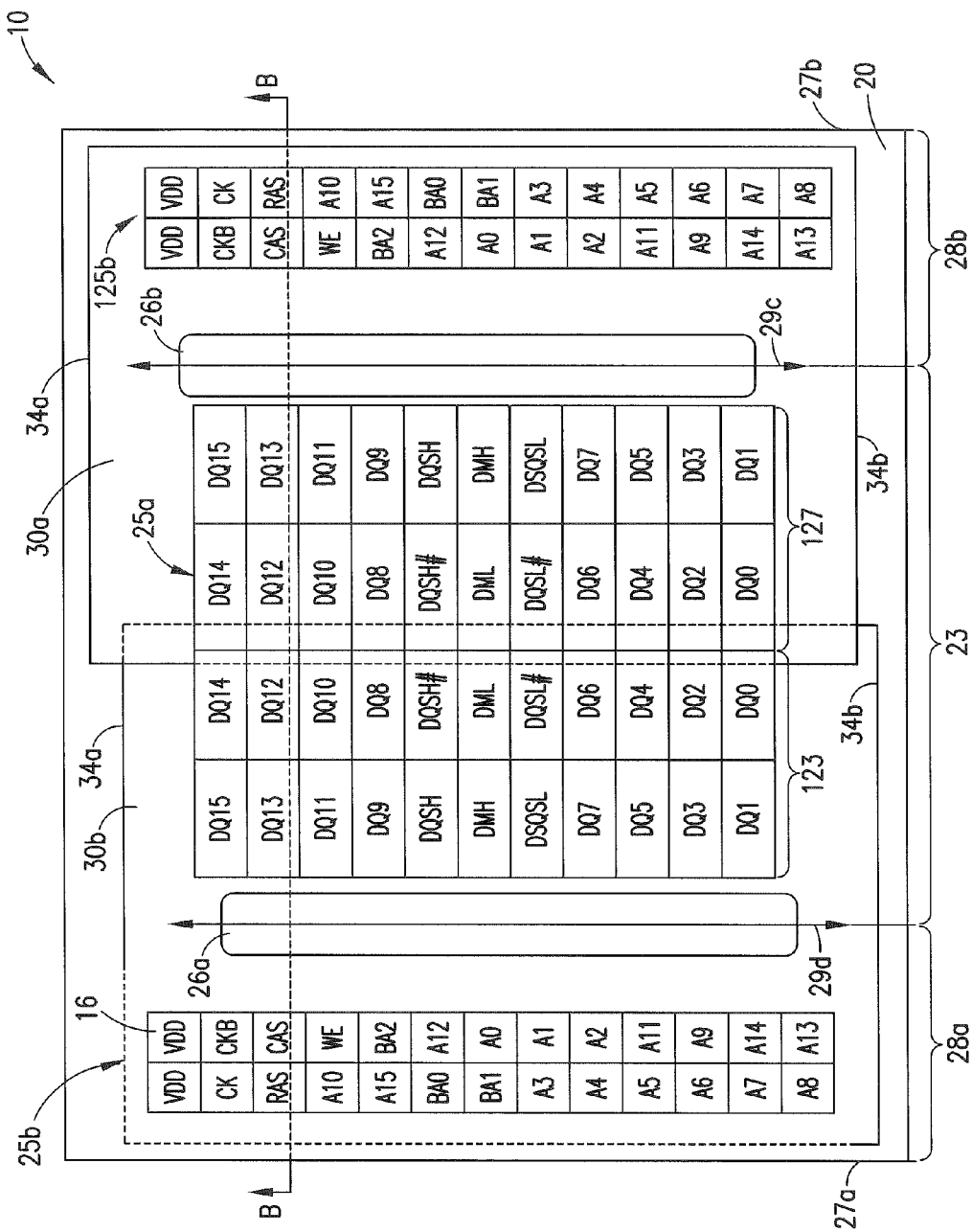
FIG. 5A is a diagrammatic plan view of a microelectronic package according to an embodiment of the present invention.
Figure 5B:
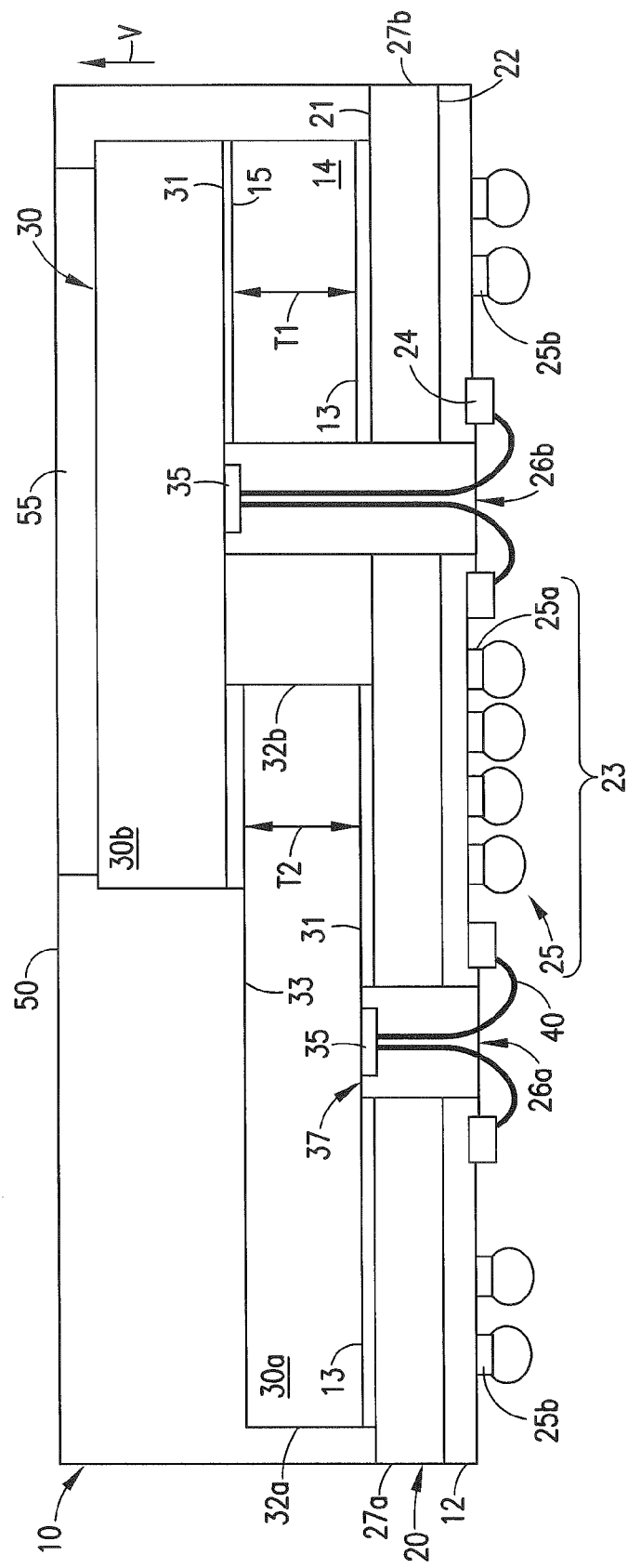
FIG. 5B is a sectional view of the microelectronic assembly of FIG. 5A, taken along the line B-B of FIG. 5A.

FIGS. 5A and 5B illustrate a particular type of microelectronic package 10 configured so as to permit the lengths of stubs to be reduced when first and second such packages are mounted opposite one another on opposite surfaces of a circuit panel, e.g., a circuit board, module board or card, or flexible circuit panel. As seen in FIGS. 5A and 5B, the microelectronic package 10 can include packaging structure, for example, a dielectric element or substrate 20, e.g., a support element which includes or consists essentially of dielectric material, e.g., organic or inorganic dielectric material such as, without limitation, oxides, nitrides, or combinations thereof, epoxies, polyimides, thermoset materials or thermoplastics, or other polymeric materials, or composite materials such as epoxy-glass, which can be FR-4 or BT resin structures, or which can be a portion of a tape utilized in tape-automated bonding ("TAB"), for example. The dielectric element 20 has first and second oppositely facing surfaces 21 and 22.

In some cases, the dielectric element 20 can consist essentially of a material having a low coefficient of thermal expansion ("CTE") in a plane of the substrate (in a direction parallel to the first surface 21 of the substrate), i.e., a CTE of less than 12 parts per million per degree Celsius (hereinafter, "ppm/° C."), such as a semiconductor material e.g., silicon, or a dielectric material such as ceramic material or silicon dioxide, e.g., glass. Alternatively, the substrate 20 may include a sheet-like substrate that can consist essentially of a polymeric material such as polyimide, epoxy, thermoplastic, thermoset plastic, or other suitable polymeric material or that includes or consists essentially of composite polymeric-inorganic material such as a glass reinforced structure of BT resin (bismaleimide triazine) or epoxy-glass, such as FR-4, among others. In one example, such a substrate 20 can consist essentially of a material having a CTE of less than 30 ppm/° C. in the plane of the dielectric element, i.e., in a direction along its surface.

In FIGS. 5A and 5B, the directions parallel to the first surface 21 of the dielectric element 20 are referred to herein as "horizontal" or "lateral" directions, whereas the directions perpendicular to the first surface are referred to herein as upward or downward directions and are also referred to herein as the "vertical" directions. The directions referred to herein are in the frame of reference of the structures referred to. Thus, these directions may lie at any orientation to the normal "up" or "down" directions in a gravitational frame of reference.

A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

First and second apertures 26a, 26b can extend between the first and second surfaces 21, 22 of the dielectric element 20. As can be seen in FIG. 5A, the dielectric element 20 can have two apertures 26a and 26b extending therethrough. The longest dimensions of the apertures 26a and 26b can define first and second parallel axes 29a and 29b (collectively axes 29). The first and second parallel axes 29a and 29b can define a central region 23 of the second surface 22 of the dielectric element 20 located between the axes 29a and 29b. A first peripheral region 28a of the second surface is disposed between axis 29a and the peripheral edge 27a of the dielectric element. A second peripheral region 28b of the second surface is disposed between axis 29b and a peripheral edge 27b of the dielectric element opposite from peripheral edge 27a. Hereinafter, a statement that a terminal is disposed between an aperture of a substrate and a given feature of a substrate or package such as a peripheral edge thereof shall mean that the terminal is disposed between an axis of the aperture and the given feature.

The dielectric element 20 can have a plurality of terminals 25, e.g., conductive pads, lands, or conductive posts at the second surface 22 of the dielectric element 20. As used in this disclosure with reference to a component, e.g., an interposer, microelectronic element, circuit panel, substrate, etc., a statement that an electrically conductive element is "at" a surface of a component indicates that, when the component is not assembled with any other element, the electrically conductive element is available for contact with a theoretical point moving in a direction perpendicular to the surface of the component toward the surface of the component from outside the component. Thus, a terminal or other conductive element which is at a surface of a substrate may project from such surface; may be flush with such surface; or may be recessed relative to such surface in a hole or depression in the substrate.

Figure 5E:
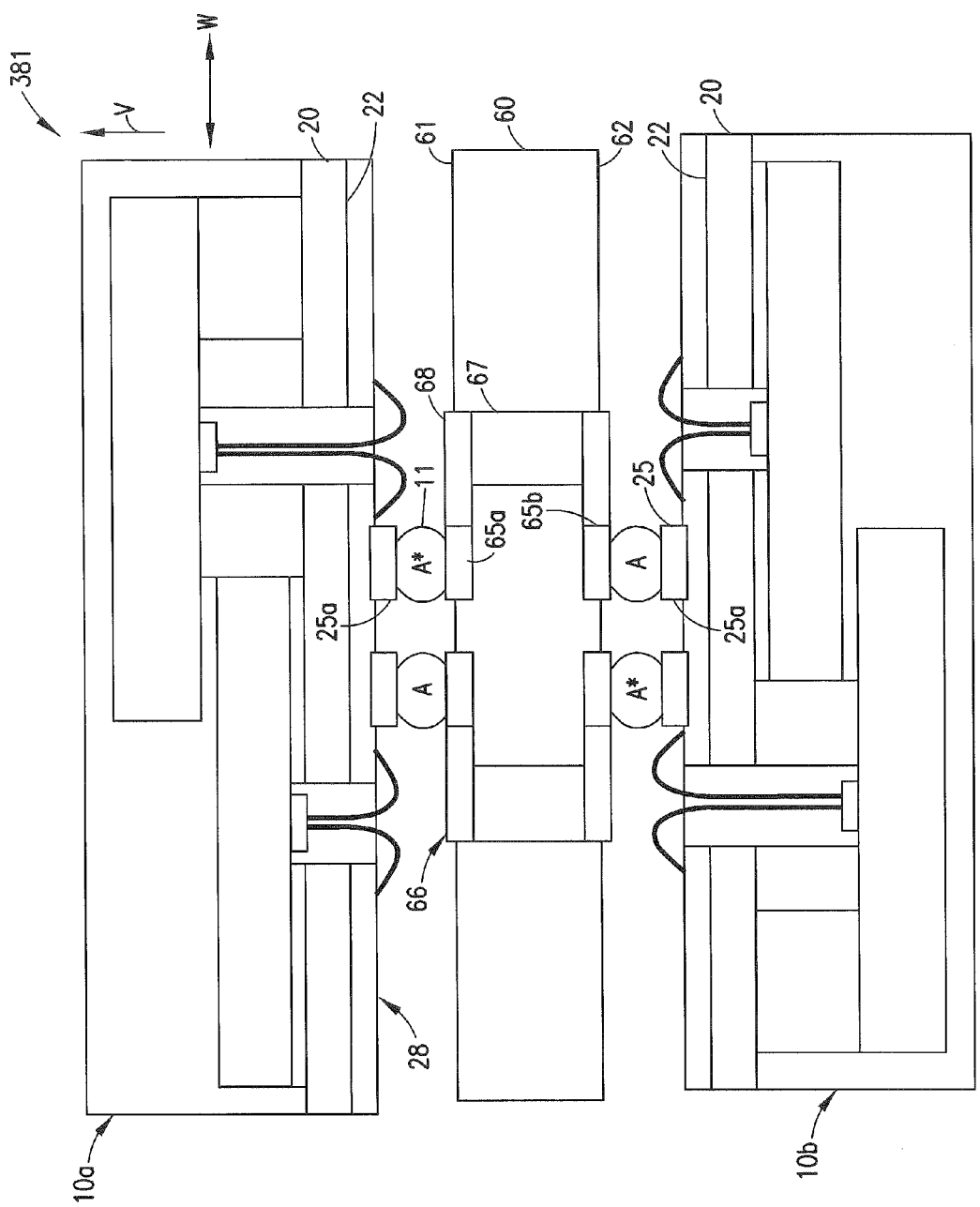
FIG. 5E is one possible sectional view of a microelectronic assembly including two microelectronic packages as shown in FIG. 5A, taken along the line B-B of FIG. 5A.
Figure 5F:
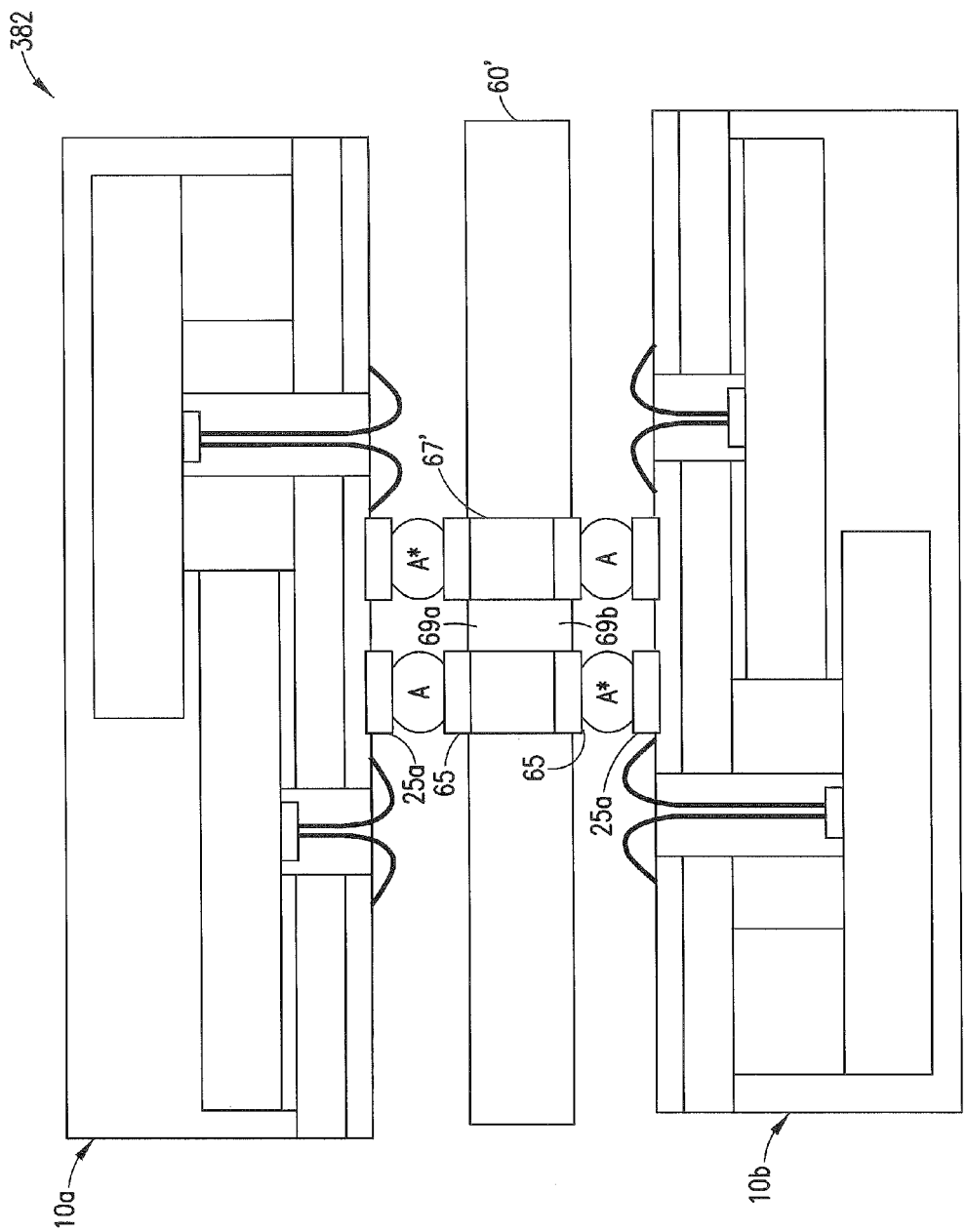
FIG. 5F is another possible sectional view of a microelectronic assembly including two microelectronic packages as shown in FIG. 5A, taken along the line B-B of FIG. 5A.

The terminals 25 can function as endpoints for the connection of the microelectronic package 10 with corresponding electrically conductive elements of an external component such as the contacts of a circuit panel, e.g., printed wiring board, flexible circuit panel, socket, other microelectronic assembly or package, interposer, or passive component assembly, among others (e.g., the circuit panel 60 or 60' shown in FIG. 5E or FIG. 5F). In one example, such a circuit panel can be a motherboard or DIMM module board.

In one example, terminals 25a that are disposed in the central region 23 of the second surface 22 of the dielectric element 20 can be configured to carry data signals. These terminals are referred to herein as "first terminals." In one example, the first terminals can be configured to carry one or more of data strobe signals, or other signals or reference potentials such as chip select, reset, power supply voltages, e.g., Vdd, Vddq, and ground, e.g., Vss and Vssq. The first terminals 25a may include terminals assigned to carry data signals and also data masks and "on die termination" (ODT) signals used to turn on or off parallel terminations to termination resistors.

Typically, the first terminals are configured to carry all bi-directional data signals for writing of data to and for reading of data from random access addressable locations of at least a main memory storage array within each DRAM microelectronic element. However, in some cases some of the first terminals can carry uni-directional data signals for input to a microelectronic element for writing of data to a memory storage array, and some of the first terminals can carry uni-directional data signals output from a microelectronic element based on data read from a memory storage array.

The microelectronic package 10 can include joining elements 11 attached to the terminals 25 for connection with an external component. The joining elements 11 can be, for example, masses of a bond metal such as solder, tin, indium, a eutectic composition or combination thereof, or another joining material such as an electrically conductive paste, an electrically conductive adhesive or electrically conductive matrix material or a combination of any or all of such bond metals or electrically conductive materials. In a particular embodiment, the joints between the terminals 25 and contacts of an external component (e.g., the circuit panel 60 shown in FIG. 5E) can include an electrically conductive matrix material such as described in commonly owned U.S. patent application Ser. Nos. 13/155,719 and 13/158,797, the disclosures of which are hereby incorporated herein by reference. In a particular embodiment, the joints can have a similar structure or be formed in a manner as described therein.

The microelectronic package 10 can comprise a plurality of microelectronic elements 30 each having a front face 31 facing the first surface 21 of the dielectric element 20. Although the microelectronic elements 30 are shown in FIG. 5A and the other figures as being offset from one another in a direction parallel to the axes 29, that need not be the case. Such an offset of the microelectronic elements 30 is shown in the figures for improved clarity of the overlying location of the microelectronic elements with respect to one another. In a particular embodiment, peripheral edges 34a of each of the microelectronic elements 30 can lie in a first common plane, and peripheral edges 34b opposite the peripheral edges 34a of each of the microelectronic elements can lie in a second common plane.

In one example, the microelectronic elements 30 can each comprise a memory storage element such as a dynamic random access memory ("DRAM") storage array or that is configured to predominantly function as a DRAM storage array (e.g., a DRAM integrated circuit chip). As used herein, a "memory storage element" refers to a multiplicity of memory cells arranged in an array, together with circuitry usable to store and retrieve data therefrom, such as for transport of the data over an electrical interface.

As further seen in FIGS. 5C and 5D, each microelectronic element 30 can have a plurality of electrically conductive element contacts 35 exposed at the front surface 31 thereof. The contacts 35 of each microelectronic element 30 can be arranged in one (FIG. 5C) or in two or more (FIG. 5D) columns 36 disposed in a central region 37 of the front face 31 that occupies a central portion of an area of the front face. As used herein with respect to a face (e.g., a front face, a rear face) of a microelectronic element, "central region" means an area, such as region 37, occupying a middle third 41c of a distance 38 between opposite peripheral edges 32a, 32b of the microelectronic element 30 in a direction orthogonal to the edges 32a, 32b. The central region 37 is disposed between peripheral regions 43a, and 43b, each of which lies between the central region 37 and a respective peripheral edge 32a or 32b, and each peripheral region also occupying an area covering a respective third 41a or 41b of the distance 38 between the opposite peripheral edges 32a, 32b. In the particular example shown in FIG. 5C, when the contacts 35 of each microelectronic element 30 are arranged in a central region 37 of the microelectronic element, the contacts can be arranged along an axis 39 that bisects the microelectronic element. As shown in FIG. 5B, the contacts 35 of each microelectronic element 30 can be aligned with at least one of the apertures 26. In one example, the contacts of microelectronic element 30a can be aligned only with one of the apertures 26 and the contacts of microelectronic element 30b can be aligned only with the other one of the apertures 26.

Electrical connections between the contacts 35 and the terminals 25a, 25b, 125b can include leads, e.g., wire bonds 40, or other possible structure in which at least portions of the leads are aligned with at least one of the apertures 26. For example, as seen in FIG. 5B, at least some of the electrical connections can include a wire bond 40 that extends beyond an edge of an aperture 26 in the dielectric element 20, and is joined at one end to the contact 35 of a microelectronic element and to a conductive element 24 of the dielectric element 20 at another end. In one embodiment, at least some of the electrical connections between the dielectric element and the contacts of the microelectronic element can be through lead bonds, i.e., leads which are integral with other conductive elements on the dielectric element and which extend in a lateral direction along one or both of the first and second surfaces 21, 22 of the dielectric element 20 and are bonded to contacts of one or more of the microelectronic elements, each lead having a portion aligned with at least one of the apertures 26.

In operation, at least some signals that pass through the first terminals 25a of the package can be common to at least two of the microelectronic elements 30. These signals can be routed through connections such as conductive traces extending on or within the dielectric element 20 in directions parallel to the first and second surfaces 21, 22 of the dielectric element from the terminals 25 to the corresponding contacts 35 of the microelectronic elements 30. For example, a first terminal 25a disposed in the central region 23 of the second surface 22 of the dielectric element 20 can be electrically coupled with a conductive contact 35 of each microelectronic element 30 through a conductive trace, a conductive element 24, e.g., a bond pad, and a wire bond 40 joined to the conductive element 24 and the contact 35.

Figure 6:
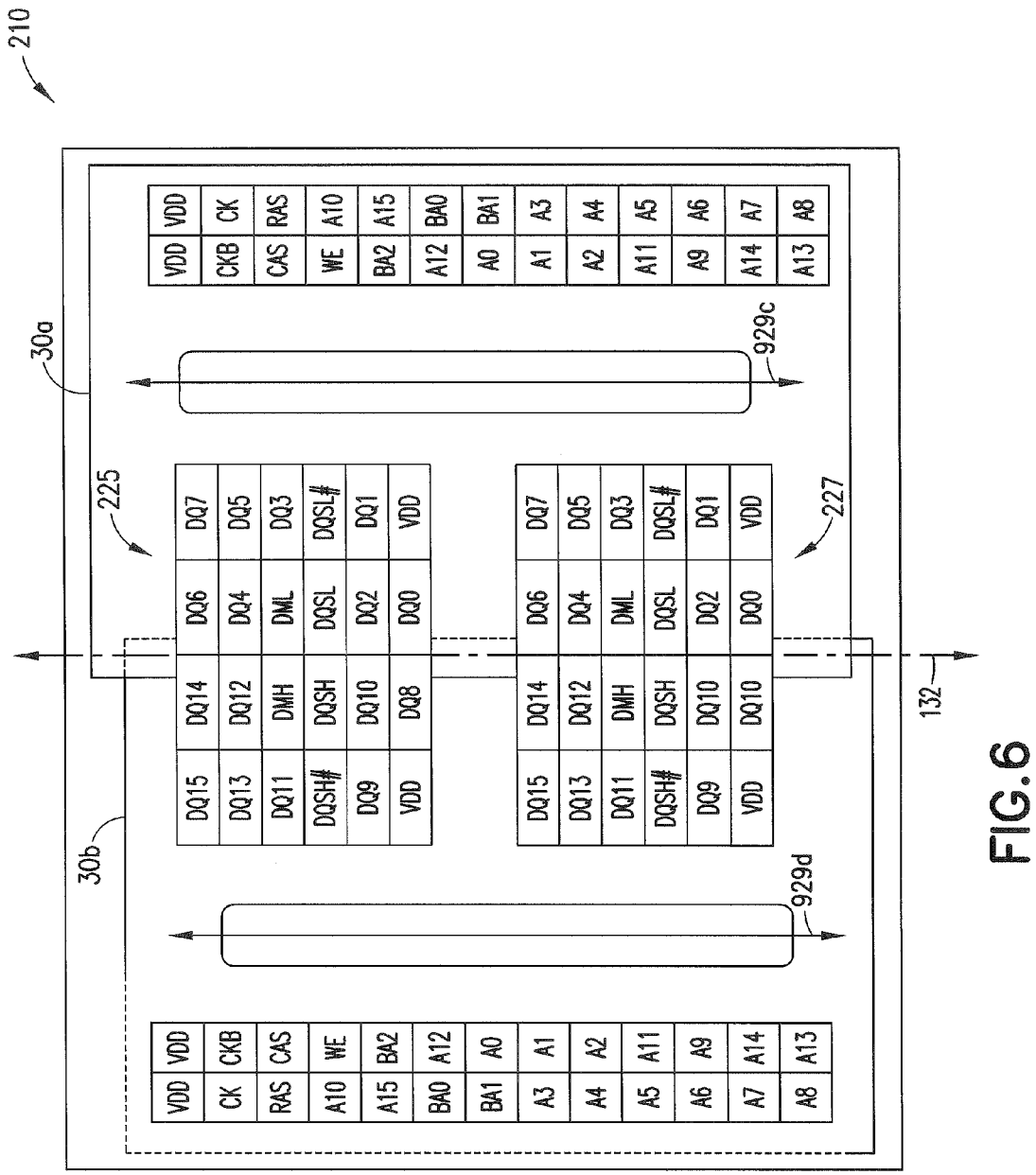
FIG. 6 is a diagrammatic bottom plan view of a microelectronic package according to another embodiment of the present invention.

In one example, as further shown in FIG. 6, the first terminals of microelectronic package 210 can be configured to have modulo-X symmetry. In this arrangement, the assignments of the data signals to the spatial positions of the second terminals on the microelectronic package, such as for data signals DQ0, DQ1, . . . , for example, have modulo-X symmetry about a theoretical vertical axis 132. The modulo-X symmetry can help improve signal integrity in an assembly 381 or 382 such as seen in FIGS. 5E and 5F, in which one or more pairs of first and second packages 10a, 10b are mounted opposite one another to a circuit panel, and electrically conductive structure on which data signals are transmitted on the circuit panel are electrically coupled with corresponding pairs of first terminals of those first and second packages in each oppositely mounted package pair.

As used herein, "modulo-X" means the modulo operation, wherein "X" is one of: a number defined by $2^n$ (2 to the power of n), wherein n is a whole number greater than or equal to 2; or 8×N, N being a whole number greater than 2. Thus, in various examples, X can be equal to the number of bits in a half-byte (4 bits), a byte (8 bits), or any whole number of bytes (8×N, N being two or more). Modulo-X symmetry is defined as follows. When the signal assignments of terminals have "modulo-X symmetry" about an axis 132 such as depicted in FIG. 6, terminals that have signal assignments numbered the same after performing the "modulo-X" operation are disposed at positions which are symmetric about the axis. An example is provided regarding the operation modulo-8 as follows. A number resulting from performing the modulo-8 operation on the operand 8 is 0. This operation can stated as "8 modulo 8=0". Similarly, a number resulting from performing the operation 9 modulo 8 is 1. Therefore, when the signal assignments have modulo-8 symmetry, a terminal which is configured to carry a signal such as DQ1, for which the modulo-8 operation yields a result of "1", is disposed at a position on the substrate which is symmetric about an axis with another terminal configured to carry a signal such as DQ9 or DQ17 for which the modulo 8 operation yields the same result, i.e., "1".

Thus, in one example, when there is modulo-8 symmetry as shown in FIG. 6, the signal assignment of a package terminal DQ0 in group 225 is configured to carry data signal DQ0 is symmetric about the vertical axis 132 with the signal assignment of another package terminal DQ8 configured to carry data signal DQ8. The same is true for the signal assignments of package terminals DQ0 and DQ8 in group 227 about the vertical axis. Modulo-8 symmetry such as described herein can be seen in each of the terminal groups 225 and 227 with respect to each of the signal assignments of package terminals DQ0 through DQ15. In an assembly 381 or 382 such as in FIG. 5E or FIG. 5F, modulo-X symmetry can permit the electrical connections between first terminals of a first package 10a and a second package 10b to be made between terminals which are aligned within one ball pitch of one another in x and y directions parallel to the surface 61 of the circuit panel. Thus, in the example seen in FIG. 5E, a terminal DQ0 of a first package 10a can be electrically connected to a terminal DQ8 of the second package 10b through connection "A" connected to package 10a, the circuit panel 60, and connection "A*" connected to package 10b. In this case, the numbers corresponding to the data signal assignments of the terminals at connection "A" to package 10a and at connection "A*" to package 10b, respectively, differ by the modulo-X operation (X being 8 in this case). As seen in FIG. 5E, Vias 67 can extend straight through the circuit panel in a direction orthogonal to surface 60. In the example in FIG. 5E, the electrical connections between the terminals may extend through the vias 67 as well as some wiring 66, 68 that extends in one or more directions parallel or substantially to surfaces 61, 62 of the circuit panel.

In a further example shown in FIG. 5F, the electrical connections between the first terminals of the first and second packages 10a, 10b can be made even shorter, wherein some or all of the wiring 66, 68 can be omitted and the connection between a first terminal of package 10a at "A" and a corresponding first terminal of package 10b at "A*" can be made in a direction essentially straight through, i.e., normal to, the thickness of the circuit panel.

In addition, as further seen in FIG. 6, the microelectronic package 210 can include two groups 225, 227 of first terminals, each group of which includes 16 DQ terminals electrically coupled to 16 DQ contacts of one or more of the microelectronic elements 30a, 30b included in the package 210. The two groups of first terminals can be utilized in varying ways as will be described further below in accordance with the section below relating to a co-support aspect of the invention.

Referring again to FIG. 5B, a spacer 14 can be positioned between the front surface 31 of the second microelectronic element 30b and a portion of the first surface 21 of the dielectric element 20. Such a spacer 14 can be made, for example, from a dielectric material such as silicon dioxide, a semiconductor material such as silicon, and may include one or more layers 13, 15 of adhesive, or may be adhered to the second microelectronic element 30b and the dielectric element 20 through such adhesive layers. In one embodiment, the spacer 14 can have substantially the same thickness T1 in a vertical direction V substantially perpendicular to the first surface 21 of the dielectric element 20 as the thickness T2 of the first microelectronic element 30a between the front and rear surfaces 31, 33 thereof.

In addition, the one or more adhesive layers 13, 15 can be positioned between the first microelectronic element 30a and the dielectric element 20, between the first and second microelectronic elements 30a and 30b, between the second microelectronic element 30b and the spacer 14, and between the spacer 14 and the dielectric element 20. Such adhesive layers 13 can include adhesive for bonding the aforementioned components of the microelectronic package 10 to one another. In a particular embodiment, the one or more adhesive layers 13 can extend between the first surface 21 of the dielectric element 20 and the front surface 31 of the first microelectronic element 30a. In one embodiment, the one or more adhesive layers 13 can attach at least a portion of the front surface 31 of the second microelectronic element 30b to at least a portion of the rear surface 33 of the first microelectronic element 30a.

In one example, each adhesive layer 13 can be partly or entirely made of a die attachment adhesive and can be comprised of a low elastic modulus material such as silicone elastomer. In one embodiment, the die attachment adhesive can be compliant. In another example, each adhesive layer 13 can be entirely or partly made of a thin layer of high elastic modulus adhesive or solder if the two microelectronic elements 30 are conventional semiconductor chips formed of the same material, because the microelectronic elements will tend to expand and contract in unison in response to temperature changes. Regardless of the materials employed, each of the adhesive layers 13 can include a single layer or multiple layers therein. In a particular embodiment where the spacer 14 is made from an adhesive, the adhesive layers 13 positioned between the spacer 14 and the second microelectronic element 30b and the dielectric element 20 can be omitted.

The microelectronic package 10 can also include an encapsulant 50 that can optionally cover, partially cover, or leave uncovered the rear surfaces 33 of the microelectronic elements 30. For example, in the microelectronic package 10 shown in FIG. 5B, an encapsulant can be flowed, stenciled, screened or dispensed onto the rear surfaces 33 of the microelectronic elements 30. In another example, the encapsulant 50 can be a mold compound which is formed thereon by overmolding.

The microelectronic package 10 can further include an encapsulant (not shown) that can optionally cover the wire bonds 40 and the conductive elements 24 of the dielectric element 20. Such an encapsulant can also optionally extend into the apertures 26, and it can cover the contacts 35 of the microelectronic elements 30.

The microelectronic elements 30 in a microelectronic package 10 can be configured in accordance with one of several different standards, e.g., standards of JEDEC, which specify the type of signaling that semiconductor chips (such as the microelectronic elements 30) transmit and receive through the contacts 35 thereof. Thus, in one example, each of the microelectronic elements 30 can be of DDRx type, i.e., configured in accordance with one of the JEDEC double data rate DRAM standards DDR3, DDR4, or one or more of their follow-on standards (collectively, "DDRx"). Each DDRx type microelectronic element can be configured to sample the command and address information coupled to the contacts thereof at a first sampling rate, such as once per clock cycle (e.g., on the rising edge of the clock cycle). In particular examples, the DDRx type microelectronic elements can have four, eight or sixteen contacts used for transmitting and receiving bi-directional data signals, each such bi-directional signal referred to as a "DQ" signal. Alternatively, the first terminals of a package can be configured to carry uni-directional data signals such as data signals or "D" signals input to the package and data signals "Q" output from the package, or can be configured to carry a combination of bi-directional and uni-directional data signals.

As further seen in FIG. 5A, in addition to first terminals 25a, groups 25b, 125b of second terminals can be disposed in first peripheral region 28a and in second peripheral region 28b of the second surface, respectively. Each of the groups of second terminals 25b, 125b comprises terminals configured to carry address information. For example, when the microelectronic elements 30a, 30b include or are DRAM semiconductor chips, each group of second terminals 25b, 125b can be configured to carry sufficient address information transferred to the microelectronic package 10 that is usable by circuitry within the package, e.g., row address and column address decoders, and bank selection circuitry of one or more of the microelectronic elements 30 to determine an addressable memory location from among all the available addressable memory locations of a memory storage array within a microelectronic element in the package. In a particular embodiment, each group of the second terminals 25b, 125b can be configured to carry all the address information used by such circuitry within the microelectronic package 10 to determine an addressable memory location within such memory storage array.

In one example, the second terminals disposed in the first peripheral region have signal assignments which are symmetric about a theoretical axis with the signal assignments of second terminals disposed in the second peripheral region. The theoretical axis extends parallel to the longitudinal axis of each of the apertures and is disposed between the proximate edges of the respective apertures. Typically, the theoretical axis is disposed at or near the median distance between the proximate edges of the respective apertures. "Symmetric" as used herein in connection with signal assignments of terminals for carrying address information means that the signal assignment of a terminal on a first side of the theoretical axis has a name and numerical weight which are the same as that of another terminal on an opposite side of the axis at a position symmetric about the axis from the terminal on the first side. The "numerical weight" of the address information assigned to a given terminal refers to the place of that address information within the places of an address that is specified by the address information. For example, an address can be specified by 20 address bits A0 ... A19. Each bit has a numerical weight, from the highest-ordered address information bit A19, which has a numerical weight of 19 representing 2^19 (2 to the power of 19), to the lowest-ordered address information bit A0, which has a numerical weight of zero representing 2^0 (2 to the power of zero), which is the 1's place of the address.

In one example, the second terminals can be configured to carry each of a group of signals of a command-address bus of the microelectronic element; i.e., command signals, address signals, bank address signals, and clock signals that are transferred to the microelectronic package, wherein the command signals include write enable, row address strobe, and column address strobe signals, and the clock signals are clocks used for sampling the address signals. While the clock signals can be of various types, in one embodiment, the clock signals carried by these terminals can be one or more pairs of differential clock signals received as differential or true and complement clock signals.

On a circuit panel, e.g., a printed circuit board, module card, etc., these above-noted signals of the command-address bus: i.e., command signals, address signals, bank address signals, and clock signals, can be bussed to multiple microelectronic packages that are connected thereto in parallel, particularly to first and second microelectronic packages mounted to opposite surfaces of the circuit panel in a clamshell configuration as seen in FIGS. 5E through 5H, for example. In such configuration, for certain embodiments herein, first and second groups of the second terminals can be disposed in respective first and second regions of a surface of a package substrate, with the address information signal assignments of the terminals having mirror-image symmetry. For example, each second terminal of the first group of second terminals, such second terminal being on a first side of theoretical axis, has a signal assignment which is symmetric about the theoretical axis with a corresponding second terminal of the second group of second terminals. In the case of address information, two terminals whose signal assignments have symmetry about the theoretical axis means each of the two terminals is assigned to carry address information having the same weight. In the case of command information, such as, for example, RAS, CAS, CLK, /CLK, and write enable, two terminals whose signal assignments have symmetry about the theoretical axis means that each of the two terminals is assigned to carry command information which has the same name. In the case of either second terminals which are configured to carry address or command information, symmetry is still present even if the second terminals in the respective first and second groups have respective identifiers: e.g., the second terminals at the corresponding positions separated by the theoretical axis have signal assignments of the same weight and are identified as A19-A and A19-B, for example.

In one example of a microelectronic package, a first group of the second terminals on a first side of theoretical axis can be electrically coupled with one of the first and second microelectronic elements, and the second group of second terminals on a second side of theoretical axis can be electrically coupled with another one of the first and second microelectronic elements. In a particular example, the first group of second terminals can be electrically coupled with a first rank or first channel of memory access in the package, and the second group of second terminals can be electrically coupled with a second rank or second channel of memory access in the package.

The presence of first and second groups of second terminals on the package having symmetry as described above can help to reduce the lengths of stubs used to carry signals from an address bus, e.g., a command-address bus 136 as seen in FIG. 2 on the circuit panel to the individual connection sites on the surfaces of the circuit panel where the microelectronic packages are electrically connected. The reductions in the lengths of these electrical connections can reduce stub lengths in the circuit panel and the assembly, which can help improve the electrical performance, such as reducing settling time, ringing, jitter, or intersymbol interference, among others, for the above-noted signals that are carried by the first terminals and that are transferred to microelectronic elements in both the first and second packages. Moreover, it may be possible to obtain other benefits as well, such as simplifying the structure of the circuit panel or reducing the complexity and cost of designing or manufacturing the circuit panel.

Moreover, it may be possible to reduce the number of routing layers of wiring on the circuit panel required to route signals to and from contacts on first and second surfaces (e.g., top and bottom surfaces) of a circuit panel to which the second terminals of first and second microelectronic packages are connected, respectively. Specifically, the number of routing layers required to route such data signals along the circuit panel may in some cases be reduced to four or fewer routing layers. In a particular example, the number of routing layers required to route such signals along the circuit panel may in some cases be reduced to four, two, or one routing layers. However, on the circuit panel, there may be a greater number of routing layers that carry other signals than the number of routing layers that carry the above-noted address or command-address bus signals.

In a variation of such embodiment, the second terminals 25a can be configured to carry a majority of the address information that is used by such circuitry within the microelectronic package 10 to determine an addressable memory location within such memory storage array, and then terminals disposed elsewhere on the package such as in central region 23 can be configured to carry the remaining part of the address information. In such variation, in a particular embodiment, the second terminals 25b, 125b can be configured to carry three-quarters or more of the address information that is used by such circuitry within the microelectronic package 10 to determine an addressable memory location within such memory storage array.

In a particular embodiment, the groups of second terminals 25b, 125b may not be configured to carry chip select information, e.g., information usable to select a particular chip within the microelectronic package 10 for access to a memory storage location within the chip. In another embodiment, at least one of the first terminals 25a may indeed carry chip select information.

In a variation of any of the foregoing embodiments, the spacer 14 can be replaced fully or partially by one or more microelectronic elements including buffer element, i.e., a chip that is configured to perform a buffering function, such microelectronic element having a surface facing the first surface 21 of the dielectric element 20. In one example, such buffer element can be flip-chip bonded to contacts exposed at the first surface 21 of the dielectric element 20. Each such buffer element can be used to provide signal isolation between terminals of the package, particularly for the above-noted command address bus signals received at the second terminals of the package, and one or more of the microelectronic elements in the package. In one example, such buffer element can be electrically connected to at least some of the terminals and one or more of the microelectronic elements 30 in the microelectronic package 10, the buffer element being configured to regenerate at least one signal received at one or more of the terminals of the microelectronic package. Typically, the one or more buffer elements regenerate signals received at the first terminals, or which are received at the second terminals, and transfers the regenerated signals to the microelectronic elements in the package.

In a particular example, such buffer element can be configured to buffer the address information, or in one example, the command signals, address signals, clock signals, or data signals that are transferred to one or more of the microelectronic elements 30a and 30b. Alternatively, or in addition to regenerating signals as described above, in a particular example, such an additional microelectronic element can be configured to partially or fully decode at least one of address information or command information received at the terminals, such as at the first terminals. The decoding chip can then output the result of such partial or full decoding for transfer to one or more of the microelectronic elements 30a and 30b.

In a particular embodiment, instead of or in addition to the buffer element and/or the decoding chip, one or more decoupling capacitors can be disposed in at least a portion of the space occupied by the spacer 14, and such decoupling capacitors can be electrically connected to internal power supply and/or ground buses inside the microelectronic package 10.

With further reference to the examples of microelectronic packages described above, each microelectronic package can be configured in accordance with one of first and second types, wherein each microelectronic package can be arranged with a pattern of terminals thereon, hereinafter referred to as the "ballout" of each package. In accordance with a co-support aspect of the invention, each such microelectronic package can be configured for ready attachment and electrical coupling to contacts of the same pattern of contacts on a circuit panel. In accordance with this aspect of the invention, terminals of the first type of package are configured for connection with a majority of the contacts of the pattern on the substrate. In addition, the terminals of the second type of package are configured for connection with a majority of the contacts of the pattern on the substrate.

Thus, in accordance with this co-support aspect, the package 10 seen in FIGS. 5A-5H may comprise DDRx type microelectronic elements. With DDRx type microelectronic elements, the package 10 may have a first configuration in which memory storage arrays of the first and second microelectronic elements 30a, 30b thereof collectively function to provide access to a single relatively wide rank of memory. For example, a single package 10 can provide a single rank of 32 bit memory access in which 16 DQ contacts of the first microelectronic element 30a are coupled to a first group 123 of the DQ terminals 25a on the package assigned to carry sixteen bi-directional data signals DQ0 . . . DQ15 as seen in FIG. 5A, and 16 DQ contacts of the second microelectronic element 30b are coupled to a second, different group 127 of the DQ terminals 25a on the package which are assigned to carry sixteen other bi-directional data signals DQ0 . . . DQ15. In this case, thirty-two bi-directional data signals are transferred in tandem on the thirty-two DQ terminals to support the 32 bit single rank memory access. Specifically, 32 bi-directional data signals are received simultaneously, i.e., on the same clock cycle by said first and second microelectronic elements through said 32 DQ terminals and 32 bi-directional data signals are output simultaneously, on the same clock cycle, by said first and second microelectronic elements through said 32 DQ terminals.

In another example, with DDRx type microelectronic elements, the package 10 seen in FIGS. 5A-5H may have a second configuration which supports access to two ranks of memory access which are not as wide as the 32 bit single rank described above. For example, a single package 10 can provide access to one 16 bit rank of memory through 16 first terminals DQ0A through DQ15A which are coupled to 16 DQ contacts of a first microelectronic element 30a. The single package 10 can also provide access to another 16 bit rank of memory through 16 first terminals DQ0B through DQ15B which are coupled to the 16 DQ contacts of the second microelectronic element 30b. Alternatively, since the package 10 provides access to dual 16 bit ranks, it may be possible to omit one of the groups 123 or 127 of the first terminals on the package, because alternatively, 16 DQ terminals on the package can be electrically coupled to 16 corresponding contacts on each of the microelectronic elements, as memory storage arrays in each microelectronic element 30a, 30b are accessed in turn rather than simultaneously.

In another example, each of the microelectronic elements 30 can be of LPDDRx type, i.e., configured in accordance with one of the JEDEC low power double data rate DRAM standards LPDDR3 or one or more of its follow-on standards (collectively, "LPDDRx"). LPDDRx type DRAM chips are available which have 32 contacts assigned to carry DQ signals. There are other differences as well. Each contact 35 on a LPDDRx type DRAM chip may be used to simultaneously carry two different signals in interleaved fashion. For example, each contact 35 on such DRAM chip can be assigned to carry one signal which is sampled on the rising edge of the clock cycle and can also be assigned to carry another signal which is sampled on the falling edge of the clock cycle. Thus, in LPDDRx type chips, each microelectronic element 30a, 30b can be configured to sample the command and address information input to the contacts thereof at a second sampling rate, such as twice per clock cycle (e.g., on both the rising edge and on the falling edge of the clock cycle). Accordingly, the number of contacts on the LPDDRx DRAM chip which carry address information or command-address bus information can also be reduced.

In still other examples, microelectronic elements 30 of a microelectronic package 10 of LPDDRx type can be configured to sample the command and address information coupled thereto at a sampling rate which is an integer multiple of a sampling rate at which command and address information are sampled in a DDRx type chip, e.g., such as at four times per clock cycle (e.g., once each on every quarter of the clock cycle). In yet another embodiment, the second sampling rate can be a non-integer multiple of the first sampling rate. For example, the second sampling rate may be non-integer multiple of 1.5 times the first sampling rate.

Besides the specific examples described above, the invention contemplates many other integer and non-integer multiple relationships between the second sampling rate and the first sampling rate, in examples where sampling of the command and address information by the microelectronic elements 30 is performed during every clock cycle, and in examples where sampling of the command and address information by the microelectronic elements is only performed during some clock cycles but not other clock cycles.

In one example, each LPDDRx microelectronic element may comprise a semiconductor chip of LPDDRx type with an additional wiring layer on a surface thereof electrically coupled with the contacts of such chip. As typically manufactured, semiconductor chips of LPDDRx type have columns of contacts disposed adjacent to first and second oppositely facing edges of the chip. Redistribution wiring can be provided to redistribute the contacts from their original positions to redistribution contacts provided in a central region of the front face of the chip as described above. For example, on LPDDRx microelectronic element 130 as seen in FIG. 5I typically has rows 135a, 135b of peripheral contacts adjacent to and parallel to peripheral edges 34a, 34b, respectively, of the semiconductor chip. Redistribution wiring in the form of traces 137 extending along the front face of the semiconductor chip can electrically couple the rows 135a, 135b of peripheral contacts with columns of redistributed contacts 235a, 235b disposed in a central region at the front face of the microelectronic element 130. Then, the LPDDRx microelectronic element 30 is assembled with another such microelectronic element 130 in a microelectronic package 10 as described in the foregoing.

As shown, the redistribution wiring can include features 139 which provide trace length matching for the connections between the rows 135a, 135b of peripheral contacts and the redistributed contacts in columns 235a, 235b. Such trace length matching features can be used to reduce differences in propagation delay of signals within a group of signals along the redistribution wiring between the peripheral contacts and the redistributed contacts. Performance can be improved by reducing these differences in propagation delay, which can help facilitate operation at increased sampling clock rates.

Figure 7:
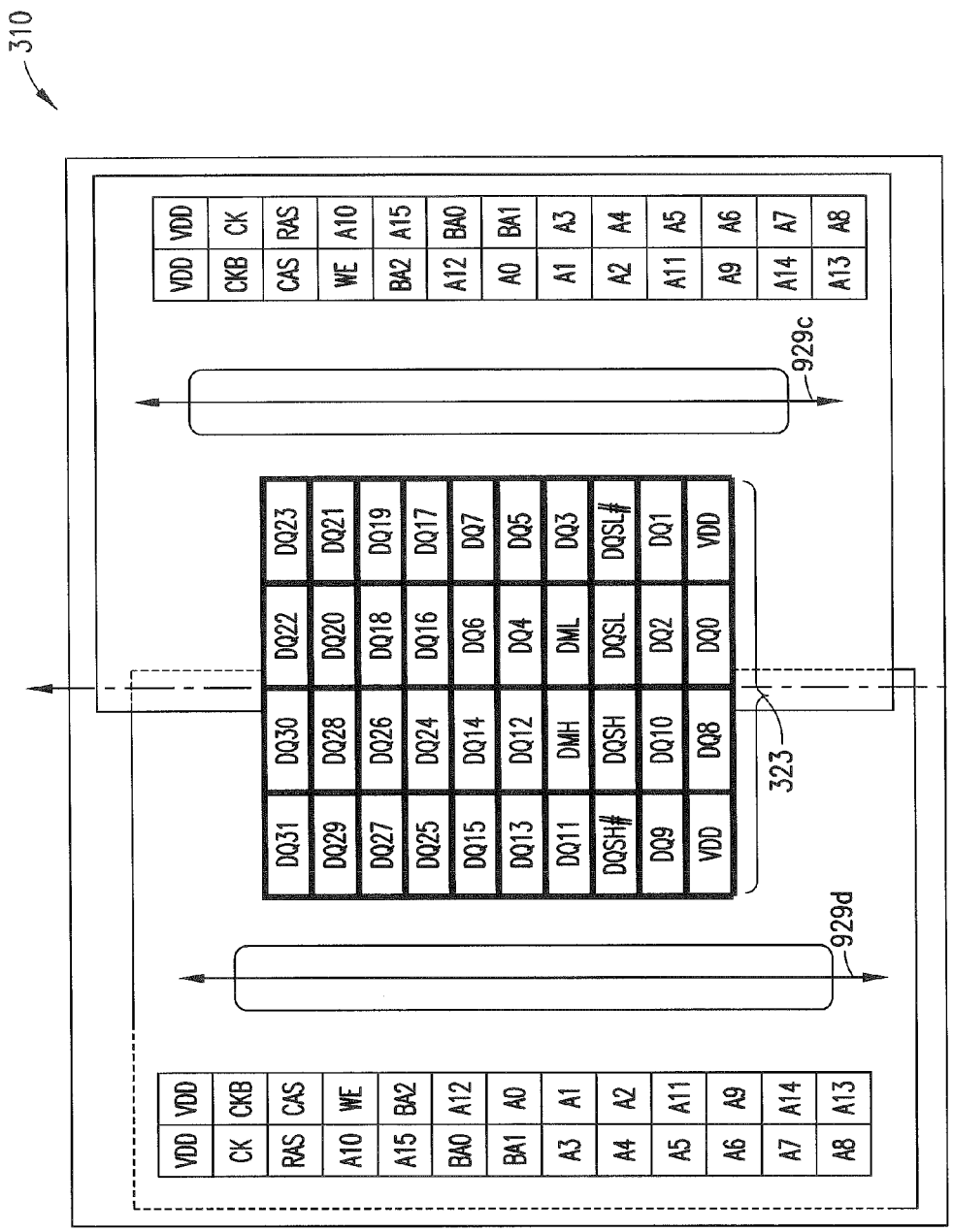
FIG. 7 is a diagrammatic bottom plan view of a microelectronic package according to another embodiment of the present invention.

In one example, a package 10 having LPDDRx type microelectronic elements 30a, 30b, can have a configuration which supports two relatively wide ranks of memory. For example, a single package 310 as seen in FIG. 7 can provide two ranks of 32 bit memory access. In one such example, 32 first terminals 323 on the package 310 can be coupled with 32 DQ contacts of the first microelectronic element 30a, and can also be coupled with 32 DQ contacts of the second microelectronic element 30b.

Referring again to FIG. 5E, in accordance with an aspect of the invention, first and second microelectronic packages 10a, 10b can assembled with a circuit panel 60 in a clamshell arrangement. Specifically, as seen in FIG. 5E, the packages 10a, 10b can be mounted opposite one another to respective panel contacts at first and second surfaces 61, 62 of a circuit panel 60, such that the first package 10a occupies the same or substantially the same area of the circuit panel as the second package 10b. Each of the microelectronic packages can have a similar structure which includes first and second microelectronic elements as described above. In FIG. 5E, for ease of illustration and description, the first terminals 15a, 25a on each respective package are shown only at two different positions in a widthwise direction W that extends between the first and second apertures of each package. As described in the foregoing, the first terminals can be spread out over a greater number of positions in the widthwise direction W. In one embodiment, the first terminals may be disposed at positions within a greater number of parallel columns of terminals, for example four parallel columns of terminals spaced at even or uneven intervals in the widthwise direction.

The modulo-X symmetric arrangement of first terminals 25a of packages 10a, 10b permit these terminals which are electrically connected to one another to be aligned to less than one ball pitch in x and y directions parallel to the surface 22 of the dielectric element.

Referring now to FIG. 5E, a microelectronic assembly 381 can include two or more microelectronic packages 10, for example, first and second microelectronic packages 10a, 10b that can be mounted to a common circuit panel 60. The circuit panel 60 can have first and second opposing surfaces 61 and 62 and pluralities of electrically conductive first and second panel contacts 65a and 65b (collectively panel contacts 65) exposed at the respective first and second surfaces. The microelectronic packages 10 can be mounted to the panel contacts 65, for example, by the joining elements 11 that can extend between the terminals 25 and the panel contacts. As shown in FIG. 5E, the second surface 22 of the dielectric element 20 of the first microelectronic package 10a and the second surface of the dielectric element of the second microelectronic package 10b can overlie at least 90% of one another. In a particular example, the circuit panel 60 can include an element having a CTE less than 30 ppm/° C. In one embodiment, such an element can consist essentially of semiconductor, glass, ceramic or liquid crystal polymer material.

In the microelectronic assemblies 381 depicted in FIGS. 5E and 5F, only the first terminals 25a of each microelectronic package are shown. The second terminals are omitted from the view for ease of illustration and description, although such second terminals are not omitted from the assembly. The second terminals of each microelectronic package 10 can be mounted to corresponding ones of the panel contacts 65, for example, by joining elements such as the joining elements 11 that can extend between the second terminals and the panel contacts.

The first terminals 25a of the first microelectronic package 10a can be electrically connected to the first terminals of the second microelectronic package 10b through the circuit panel 60. As shown in FIG. 5A, the first terminals 25a of the first microelectronic package 10a can be aligned within one ball pitch of the corresponding first terminals 25a to which they are connected of the second microelectronic package 10b. The modulo-X symmetric arrangement of first terminals 25a of packages 10a, 10b permit these terminals which are electrically connected to one another, to be aligned to less than one ball pitch in x and y directions parallel to the surface 22 of the dielectric element.

As used herein, alignment within a particular number of ball pitches means aligned within the particular number of ball pitches with respect to a horizontal direction perpendicular to the first surface of the dielectric element. In an exemplary embodiment, each pair of electrically connected first terminals of the respective first and second packages 10a, 10b can be aligned within one ball pitch of one another in orthogonal x and y directions parallel to the first surface 61 of the circuit panel 60.

In one embodiment, the first terminals of the respective first and second microelectronic packages 10a and 10b can be functionally and mechanically matched, such that each of first and second groups 15a and 15b of first terminals can have the same pattern of first terminals 25a at the second surface 22 of the dielectric element 20 of the respective microelectronic package 10a or 10b with the same function, although the particular dimensions of the length, width, and height of each microelectronic package 10 can be different than that of the other microelectronic packages.

In a particular example (not shown), a spatial distribution of the first terminals 25a along the second surface 22 of the dielectric element 20 of at least one of the first and second microelectronic packages 10 can be different from a spatial distribution of the corresponding panel contacts 65 to which they are electrically connected, such that at least one of the first terminals 25a does not directly overlie the corresponding panel contact 65 to which it is electrically connected.

As shown in FIG. 5E, the circuit panel 60 of the microelectronic assembly 381 can include one or more routing layers 66, e.g., a layer of electrically conductive traces thereon, for routing of all of the command signals, address signals, bank address signals, and clock signals. As discussed in the foregoing, and as particularly shown in FIG. 5E, vias 67 extending through the circuit panel 60 can be coupled to the panel contacts 65 by conductive structure 68 (e.g., traces) of the routing layer 66. In a particular example, the total combined length of the conductive elements (e.g., the vias 67 and the conductive structure 68) connecting a pair of electrically coupled first and second panel contacts 65a and 65b exposed at the respective first and second surfaces 61 and 62 of the circuit panel 60 can become quite short since the terminals of the packages to which they are to be connected can essentially overlie one another.

In the microelectronic assembly 381, each first terminal 25a of the first microelectronic package 10a can be electrically coupled through the circuit panel 60 to a corresponding first terminal of the second microelectronic package 10b having the same function, with a relatively short stub length. As used herein, "stub length" means the total length of the shortest electrical connection between a first terminal 25a of a microelectronic package 10 at a first surface of the circuit panel and a corresponding terminal of a microelectronic package at the second opposed surface of the circuit panel. Straight through connections here can help greatly reduce stub lengths of data terminals that are connected together of the first and second (top and bottom) packages 10a, 10b. FIG. 5F illustrates a variation of the embodiment described above relative to FIG. 5E, in which vias 67' extending through the circuit panel 60' are arranged in a common vertical plane with the first terminals 25a of each of the first and second microelectronic packages 10a, 10b. Although the vias 67' and the first terminals 25a are in a common vertical plane, corresponding first terminals 25a in each of the first and second microelectronic packages 10a and 10b can be horizontally offset from one another, so that horizontally and vertically extending conductive structure (e.g., traces and metalized vias) of the circuit panel can electrically connect the corresponding first terminals. Similar to FIG. 5E, a schematic is shown of the electrical connections between corresponding ones of the panel contacts 65 in FIG. 5F.

Figure 5G:
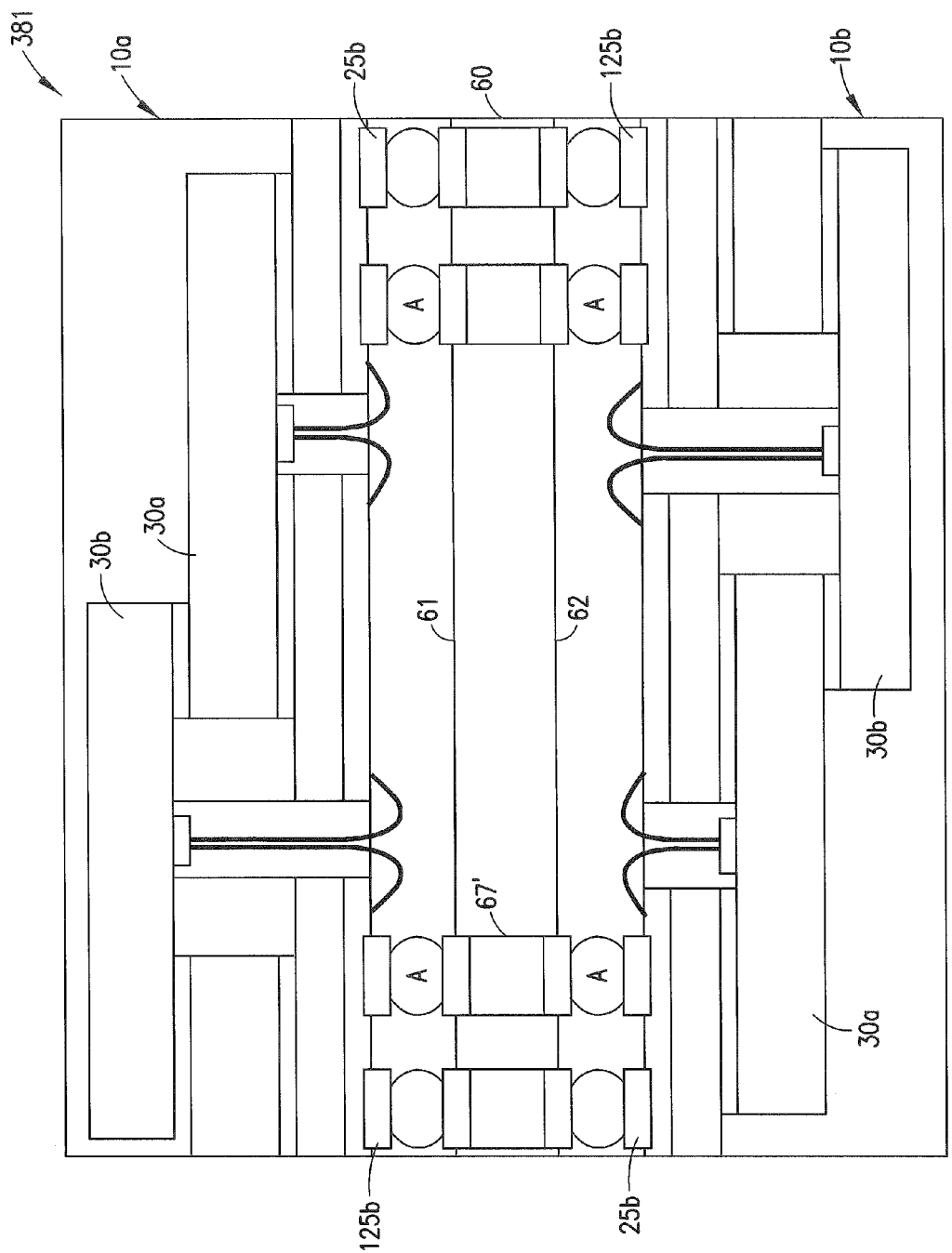
FIG. 5G is a sectional view further illustrating a microelectronic assembly including two microelectronic packages as shown in FIG. 5A, taken along the line B-B of FIG. 5A.
Figure 5H:
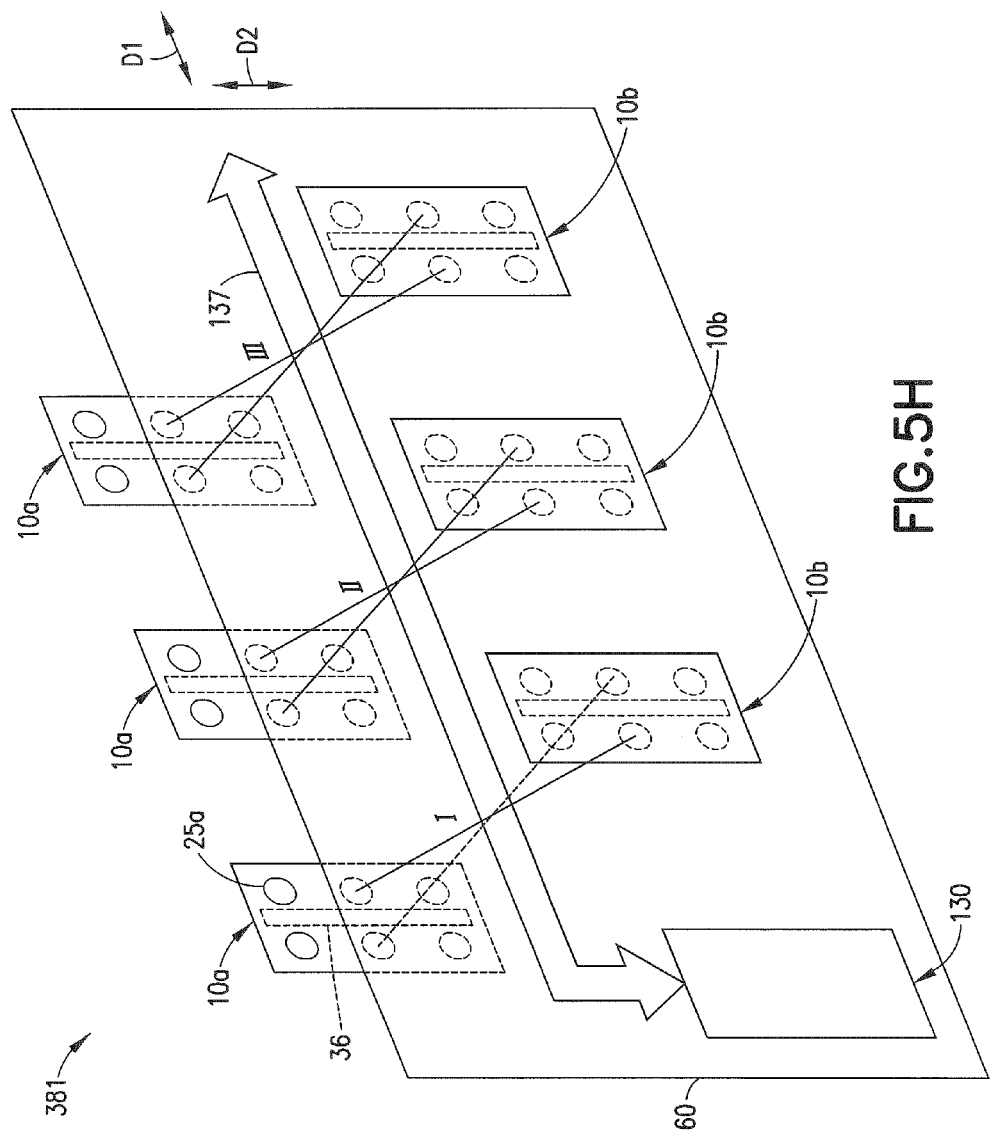
FIG. 5H is a possible diagrammatic perspective view of the microelectronic assembly of FIG. 5E showing electrical connections between terminals of the microelectronic packages.
Figure 51:
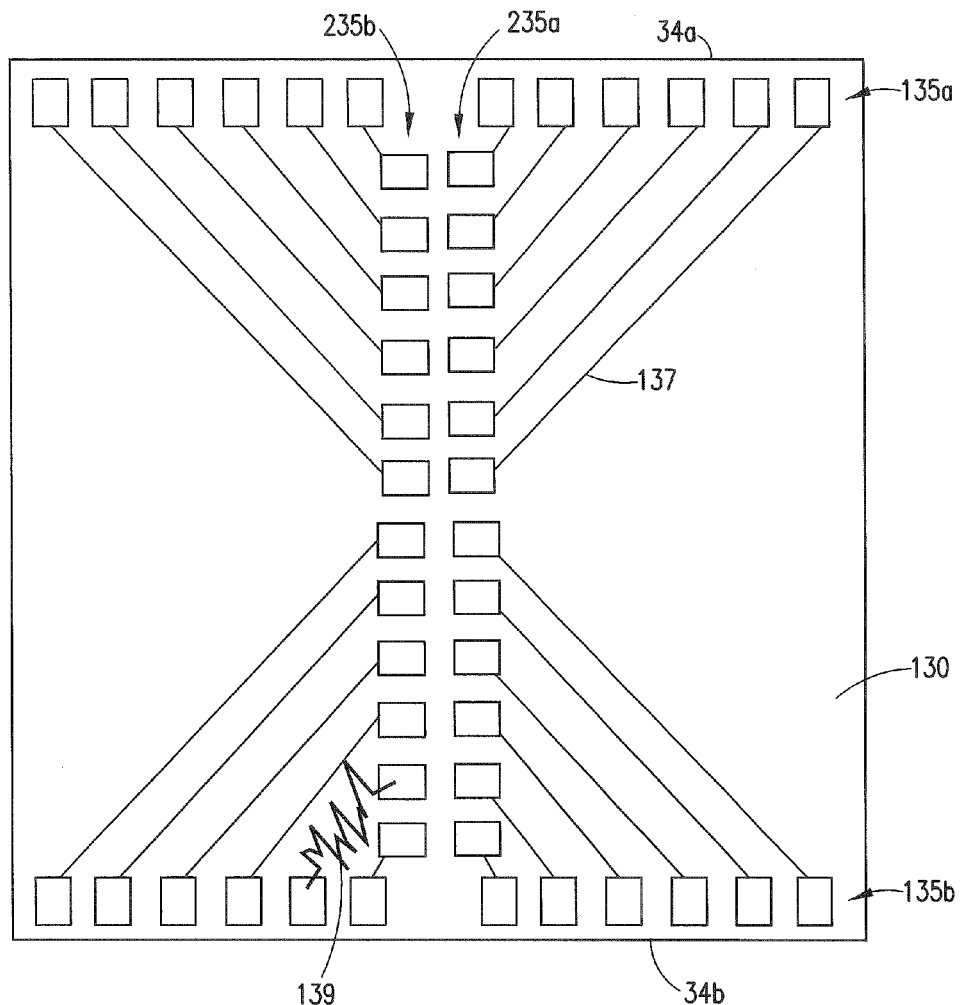

As further seen in FIG. 5H, first terminals 25a and second terminals 25b, 125b of the first microelectronic package 10a can be mounted to circuit panel 60 opposite the first terminals 25a and second terminals 25b, 125b of the second microelectronic package 10b such that second terminals of the first and second microelectronic packages 10a, 10b which are configured to carry address information of the same numerical weight lie in a common vertical plane. Such arrangement can allow at least some of the electrical connections through the circuit panel 60' that carry any type of signal such as data signals, address information, command signals, bank address signals, and clock signals to extend in directions essentially straight through the circuit panel 760 between 25b, 125b of the first and second microelectronic packages 10a, 10b. As a result, the electrical length of such connections can approximately the same as a thickness of the circuit panel.

As illustrated in FIG. 5G, the command-address bus signals can be routed in at least one direction D1 between connection sites on a circuit panel such as the circuit panel 60 at which a plurality of microelectronic packages 10a, 10b are connected, such that signals of the command-address bus 137 reach each pair of packages 10a and 10b at respective connection sites I, II or III at slightly different times. As seen in FIG. 5G, the at least one direction D1 can be transverse or orthogonal to a direction D2 in which at least one column 36 of a plurality of contacts 35 on at least one microelectronic element 30 extends. In such a way, the signal conductors of the command-address bus 137 on (i.e., on or within) the circuit panel 60 can in some cases be spaced apart from one another in the direction D2 that is parallel to the at least one column 36 of contacts 35 on a microelectronic element 30 within a package 10a or 10b connected to, or to be connected to the circuit panel 60.

Such a configuration, particularly when terminals of each microelectronic package 10a, 10b are arranged in one or more columns extending in such direction D2, may help simplify the routing of signal conductors of one or more routing layers on the circuit panel 60 used to route command-address bus signals. For example, it may be possible to simplify routing of the command-address bus signals on a circuit panel when relatively few of the second terminals are disposed at the same vertical layout position on each package. Thus, in the example shown in FIG. 5A, only two second terminals in each group of second terminals 25b, 125b may be disposed at the same vertical layout position on each package, such as, for example, the second terminals in each group which are configured to carry address signals A3 and A1.

In an exemplary embodiment, a microelectronic assembly 381 can have a microelectronic element 130 which includes a semiconductor chip configured predominantly to perform a logic function, such as a solid state drive controller, and one or more of the microelectronic elements 30 in the microelectronic packages 10*a* and 10*b* can each include memory storage elements such as nonvolatile flash memory. The microelectronic element 130 can include a special purpose processor that is configured to relieve a central processing unit of a system such as the system 1100 (FIG. 11) from supervision of transfers of data to and from the memory storage elements included in the microelectronic elements 30. Such a microelectronic element 130 including a solid state drive controller can provide direct memory access to and from a data bus on a motherboard (e.g., the circuit panel 1102 shown in FIG. 11) of a system such as the system 1100. In a particular embodiment, the microelectronic element 130 can be configured to perform a buffering function, e.g., the microelectronic element 130 can be configured to regenerate data signals or the above-noted command-address bus signals for transfer to each of the microelectronic packages 10*a* and 10*b*. Such a microelectronic element 130 can be configured to help provide impedance isolation for each of the microelectronic elements 30 with respect to components external to the microelectronic assembly 381.

In such an embodiment of the microelectronic assembly 381 having a microelectronic element 130 that includes a controller function and/or a buffering function, the command-address bus signals can be routed between the microelectronic element 130 and each pair of packages 10*a* and 10*b* at respective connection sites I, II or III. In the particular example shown in FIG. 5H, a portion of the command-address bus 137 that extends past the connection sites I, II or III can extend in the direction D2 or in another direction transverse to the direction D1 to reach contacts of the microelectronic element 130. In one embodiment, the command-address bus 137 can extend in the direction D1 to reach contacts of the microelectronic element 130.

Figure 8:
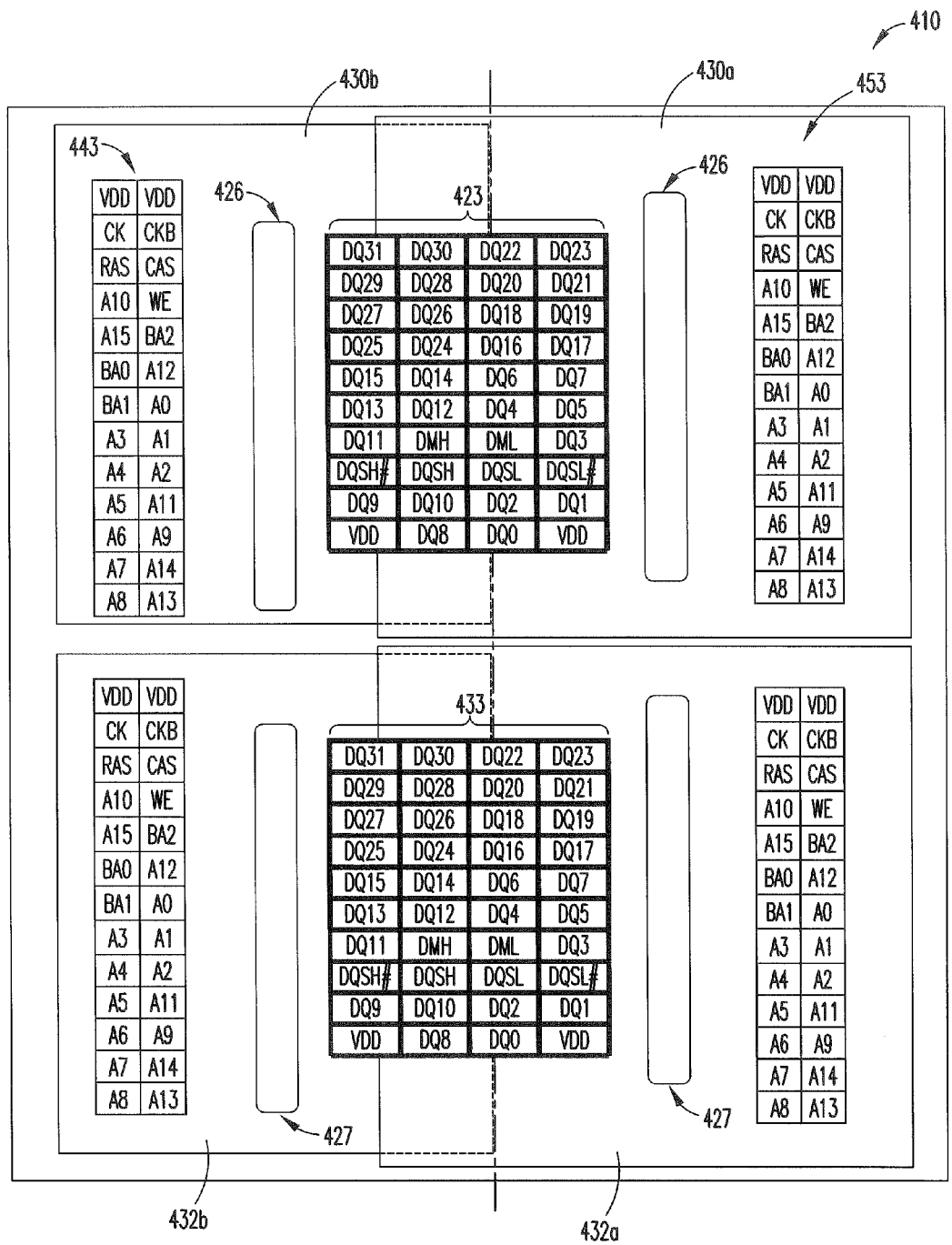
FIG. 8 is a diagrammatic bottom plan view of a microelectronic package according to another embodiment of the present invention.

FIG. 8 illustrates a variation of the embodiment described above relative to FIG. 7 in which the microelectronic package 410 includes four microelectronic elements 430*a*, 430*b*, 432*a* and 432*b*. Such package 410 is similar to that of FIG. 7 in that microelectronic elements 430*a*, 430*b* are arranged in the package 410 in like manner to the microelectronic elements shown in FIG. 7, and the first terminals 423 can be electrically coupled to contacts of the microelectronic elements 430*a*, 430*b*. Similarly, microelectronic elements 432*a*, 432*b* are arranged in package in like manner to the microelectronic elements shown in FIG. 7, and the first terminals 433 can be electrically coupled to contacts of the microelectronic elements 432*a*, 432*b*. Contacts of the microelectronic elements 430*a*, 430*b* are aligned with apertures 426 and electrical connections to the contacts can be made using a tool inserted into the aperture to form a bond between leads, e.g., integral leads or wire leads, and such contacts. Groups 443, 453 of second terminals disposed adjacent to edges 440, 442 of the package, respectively are configured for carrying address signals and can be arranged in like manner as the groups 25*b*, 125*b* of second terminals previously described above relative to FIG. 5A. Contacts of the microelectronic elements 432*a*, 432*b* are aligned with apertures 427 and electrical connections to the contacts can be made using a tool inserted into the aperture to form a bond between leads, e.g., integral leads or wire leads, and such contacts.

Figure 9:
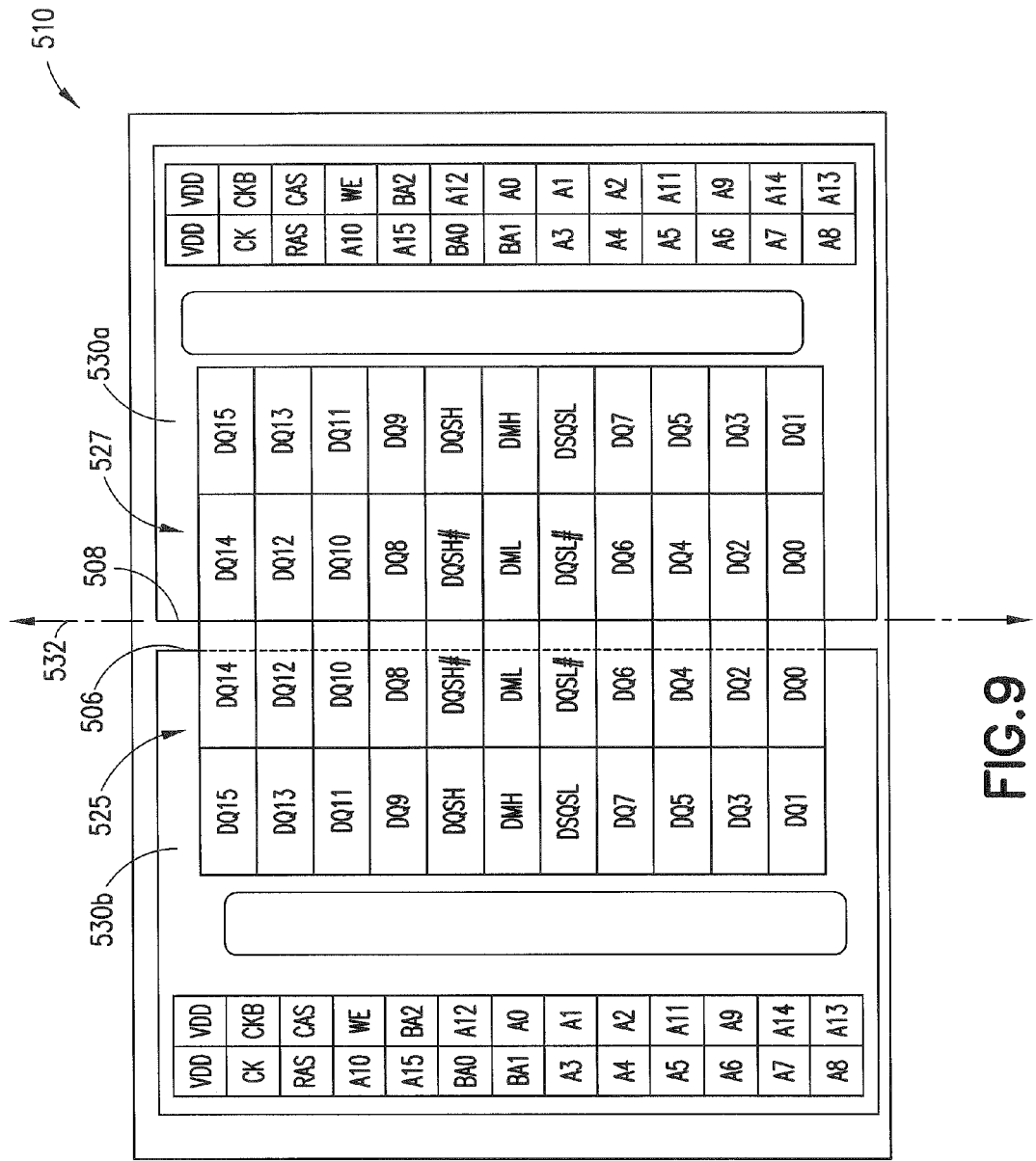
FIG. 9 is a diagrammatic bottom plan view of a microelectronic package according to another embodiment of the present invention.

FIG. 9 illustrates a microelectronic package 510 according to another variation of the embodiment seen in FIG. 5A in which nearest edges 506, 508 of the microelectronic elements 530*a*, 530*b* can be spaced apart from one another and such that the front faces (not shown) of the microelectronic elements may lie in a common place adjacent to the first surface of the substrate (not shown). In this case, the first terminals may include two groups 525, 527 of first terminals in which the signal assignment of each first terminal assigned to carry a data signal in group 225 on a first side of a theoretical axis 532 has mirror-image symmetry with the signal assignment of a corresponding first terminal on a second side of the axis opposite thereto. In a variation of the embodiment seen in FIG. 9, the first terminals may include only one group of the first terminals rather than the two groups 525, 527 which have mirror-image symmetry as described herein. In a further variation, the signal assignments of the two groups 525, 527 of first terminals have modulo-X symmetry about axis 532 similar to the modulo-X symmetry of first terminals described above relative to FIG. 6.

Figure 10:
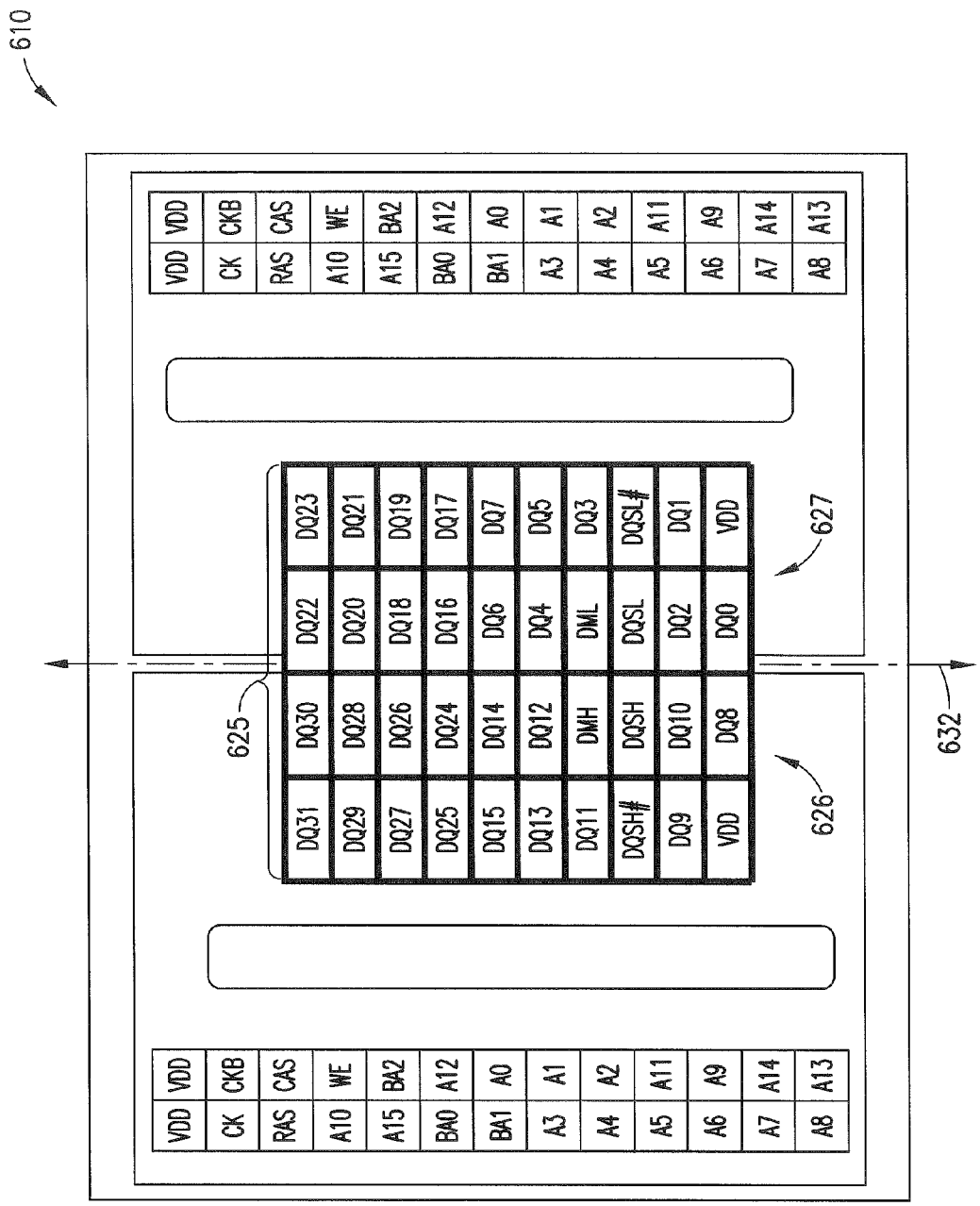
FIG. 10 is a diagrammatic bottom plan view of a microelectronic package according to another embodiment of the present invention.

Referring to FIG. 10, in a variation of the embodiment of FIG. 9, the microelectronic package 610 has 32 first terminals 625 which can be in form of DQ terminals numbered DQ0 through DQ31, and which can be arranged to support one or two 32-bit ranks of memory access, for example. As seen in FIG. 10, the first terminals 625 can be arranged at positions at a first surface of the dielectric element (FIG. 5B) in two groups 626 and 627, with each DQ terminal in a first group 626 of the first terminals on a first side of a theoretical axis 632 having modulo-8 symmetry with each DQ terminal in a second group 627 of the first terminals on a second side of the axis 632 opposite from the first side.

Figure 11:
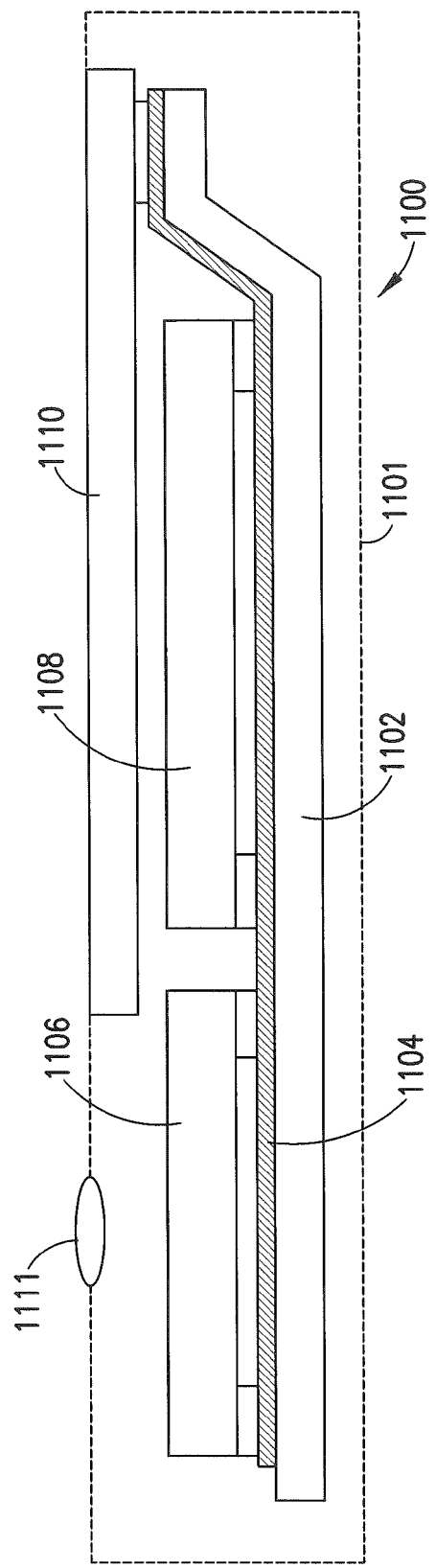
FIG. 11 is a schematic sectional view illustrating a system according to an embodiment of the invention.

The microelectronic packages and microelectronic assemblies described above with reference to FIGS. 5A through 10 can be utilized in construction of diverse electronic systems, such as the system 1100 shown in FIG. 11. For example, the system 1100 in accordance with a further embodiment of the invention includes a plurality of modules or components 1106 such as the microelectronic packages and/or microelectronic assemblies as described above in conjunction with other electronic components 1108 and 1110.

In the exemplary system 1100 shown, the system can include a circuit panel, motherboard, or riser panel 1102 such as a flexible printed circuit board, and the circuit panel can include numerous conductors 1104, of which only one is depicted in FIG. 11, interconnecting the modules or components 1106 with one another. Such a circuit panel 1102 can transport signals to and from each of the microelectronic packages and/or microelectronic assemblies included in the system 1100. However, this is merely exemplary; any suitable structure for making electrical connections between the modules or components 1106 can be used.

In a particular embodiment, the system 1100 can also include a processor such as the semiconductor chip 1108, such that each module or component 1106 can be configured to transfer a number N of data bits in parallel in a clock cycle, and the processor can be configured to transfer a number M of data bits in parallel in a clock cycle, M being greater than or equal to N. In the example depicted in FIG. 11, component 1108 can be a semiconductor chip and component 1110 is a display screen, but any other components can be used in the system 1100. Of course, although only two additional components 1108 and 1110 are depicted in FIG. 11 for clarity of illustration, the system 1100 can include any number of such components.

In one example, the system 1100 can include a processor chip 1108 that is configured to transfer thirty-two data bits in parallel in a clock cycle, and the system can also include four modules 1106 such as the microelectronic package 10 described with reference to FIG. 5A, each module 1106 configured to transfer eight data bits in parallel in a clock cycle (i.e., each module 1106 can include first and second microelectronic elements, each of the two microelectronic elements being configured to transfer four data bits in parallel in a clock cycle).

In another example, the system 1100 can include a processor chip 1108 that is configured to transfer sixty-four data bits in parallel in a clock cycle, and the system can also include four modules 1106 such as the microelectronic package 910 described with reference to FIG. 9A, each module 1106 configured to transfer sixteen data bits in parallel in a clock cycle (i.e., each module 1106 can include four microelectronic elements, each of the four microelectronic elements being configured to transfer four data bits in parallel in a clock cycle).

Modules or components 1106 and components 1108 and 1110 can be mounted in a common housing 1101, schematically depicted in broken lines, and can be electrically interconnected with one another as necessary to form the desired circuit. The housing 1101 is depicted as a portable housing of the type usable, for example, in a cellular telephone or personal digital assistant, and screen 1110 can be exposed at the surface of the housing. In embodiments where a structure 1106 includes a light-sensitive element such as an imaging chip, a lens 1111 or other optical device also can be provided for routing light to the structure. Again, the simplified system shown in FIG. 11 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

In any of the embodiments described herein, one or more of the microelectronic elements 30 can be implemented in one or more of the following technologies: DRAM, NAND flash memory, RRAM ("resistive RAM" or "resistive random access memory"), phase-change memory ("PCM"), magnetoresistive random access memory, e.g. such as may embodiment tunnel junction devices, static random access memory ("SRAM"), spin-torque RAM, or content-addressable memory, among others.

What is claimed is:

1. A microelectronic package, comprising:
   a dielectric element having first and second oppositely facing surfaces, and having first and second spaced apart apertures each extending between the first and second surfaces;
   a first microelectronic element having a front face facing said first surface, a rear face facing away from said first surface and an edge extending between said front and rear faces, said first microelectronic element having contacts exposed at said front face; and
   a second microelectronic element having a front face partially overlying said rear face of said first microelectronic element and facing said first surface, said second microelectronic element having contacts disposed in a central region of its front face, said contacts disposed beyond said edge of said first microelectronic element,
   said dielectric element having terminals at said second surface, said contacts of said first microelectronic element overlying said first aperture and electrically coupled with said terminals, and said contacts of said second microelectronic element overlying said second aperture and electrically coupled with said terminals,
   said terminals including a plurality of first terminals between said first and second apertures configured to carry all data signals for read and write access to random access addressable memory locations of memory storage arrays within the first and second microelectronic elements.

2. The microelectronic package as claimed in claim 1, wherein the first and second microelectronic elements are of type DDRx.

3. The microelectronic package as claimed in claim 2, wherein the dielectric element has first and second parallel edges extending between the first and second surfaces, a first region of the second surface disposed between the first aperture and the first edge, a second region of the second surface being disposed between the second aperture and the second edge, wherein the terminals include second terminals including at least some second terminals having address information signal assignments for specifying each individual addressable memory location within the memory storage arrays, wherein all of the second terminals are disposed at locations within at least one of the first and second regions.

4. The microelectronic package as claimed in claim 3, wherein the second terminals are disposed at locations within each of the first and second regions, wherein the signal assignments of the at least some second terminals in the first region are symmetric about a theoretical axis extending parallel to said first and second edges of said dielectric element with the signal assignments of the at least some second terminals in the second region.

5. The microelectronic package as claimed in claim 4, wherein the second terminals in each of the first and second regions include at least some second terminals having command information signal assignments, and the signal assignments of the at least some second terminals having command information signal assignments in the first region are symmetric about the theoretical axis with the signal assignments of the at least some second terminals having command information signal assignments in the second region.

6. The microelectronic package as claimed in claim 4, wherein the second terminals in the first region are coupled with said contacts of said first microelectronic element and are not coupled with said contacts of said second microelectronic element, and the second terminals in the second region are coupled with said contacts of said second microelectronic element and are not coupled with said contacts of said first microelectronic element.

7. The microelectronic package as claimed in claim 6, wherein said first and second microelectronic elements are configured to receive said data signals simultaneously at said first and second microelectronic elements and are configured to output said data signals simultaneously from said first and second microelectronic elements.

8. The microelectronic package as claimed in claim 6, wherein the first and second microelectronic elements are of type LPDDRx.

9. The microelectronic package as claimed in claim 8, wherein the dielectric element has first and second parallel edges extending between the first and second surfaces, a first region of the second surface disposed between the first aperture and the first edge, a second region of the second surface being disposed between the second aperture and the second edge, wherein the terminals include second terminals configured to carry address information for specifying each individual addressable memory location within the memory storage arrays, wherein all of the second terminals are disposed at locations within at least one of the first and second regions.

10. The microelectronic package as claimed in claim 8, wherein each of the first and second microelectronic elements has first contacts at the respective front face, and said contacts of the first microelectronic element and said contacts of the second microelectronic elements are redistribution contacts which are electrically coupled with said first contacts on the respective microelectronic element through redistribution traces extending along the front faces of said first and second microelectronic elements.

11. The microelectronic package as claimed in claim 10, wherein said edge of said first microelectronic element is a first edge, said first microelectronic element has a second edge opposite said first edge thereof, and said first contacts of said first microelectronic element are disposed adjacent to said first and second edges thereof, and said first contacts of said second microelectronic element are disposed adjacent to said first and second edges thereof.

12. The microelectronic package as claimed in claim 9, wherein the second terminals are disposed at locations within each of the first and second regions, wherein signal assignments of the second terminals in the first region are symmetric about the theoretical axis with the signal assignments of the second terminals in the second region.

13. The microelectronic package as claimed in claim 12, wherein the second terminals in each of the first and second regions include at least some second terminals having command information signal assignments, and the signal assignments of the at least some second terminals having command information signal assignments in the first region are symmetric about the theoretical axis with the signal assignments of the at least some second terminals having command information signal assignments in the second region.

14. The microelectronic package of claim 1, wherein the first terminals include a first group thereof disposed on a first side of a theoretical plane and a second group thereof disposed on a second side of the theoretical plane opposite from the first side, wherein the first terminals of the first group have modulo-X symmetry about the theoretical plane with the second group of the first terminals, X being a multiple of 8 and a whole number of at least one.

15. The microelectronic package of claim 1, further comprising leads extending through said apertures, said contacts being coupled with said terminals via said leads.

16. The microelectronic package of claim 1, wherein said leads include first leads extending through said first aperture to said contacts of said first microelectronic element and second leads extending through said second aperture to said contacts of said second microelectronic element.

17. The microelectronic package of claim 15, wherein said dielectric element includes bond pads exposed at said second surface and electrically coupled with said terminals, and said leads include wire bonds extending through said apertures from said contacts to said bond pads.

18. The microelectronic package of claim 1, further comprising leads having portions overlying said apertures, said contacts being coupled with said terminals through said leads.

19. The microelectronic package as claimed in claim 1, wherein the first and second apertures are elongated in a same direction, the same direction parallel to the edge of the first microelectronic element.

20. A microelectronic assembly, comprising:
a circuit panel having first and second oppositely facing surfaces, first panel contacts at the first surface, and second panel contacts at the second surface, respectively;
first and second microelectronic packages each having terminals mounted to the respective panel contacts,
each microelectronic package including:
a dielectric element having first and second oppositely facing surfaces, and having first and second spaced apart apertures each extending between the first and second surfaces;
a first microelectronic element having a front face facing said first surface of said dielectric element, a rear face facing away from said first surface and an edge extending between said front and rear faces, said first microelectronic element having contacts exposed at said front face; and
a second microelectronic element having a front face partially overlying said rear face of said first microelectronic element and facing said first surface of said dielectric element, a rear face facing away therefrom and first and second opposite edges each of the edges extending between the front and rear faces of the second microelectronic element, said second microelectronic element having contacts disposed in a central region of said front face occupying a middle third of a distance between the first and second opposite edges said contacts,
said dielectric element of each said package having terminals at said second surface, wherein in each said package said contacts of said first microelectronic element overlie said first aperture and are electrically coupled with the terminals, and said contacts of said second microelectronic element overlie said second aperture and are electrically coupled with the terminals,
wherein in each said package the terminals include a plurality of first terminals between said first and second apertures, the first terminals configured to carry all data signals for read and write access to random access addressable memory locations of memory storage arrays within the first and second microelectronic elements.

21. The microelectronic assembly of claim 20, wherein in each said package, the first terminals include a first group thereof disposed on a first side of a theoretical plane and a second group thereof disposed on a second side of the theoretical plane opposite from the first side, wherein the first terminals of the first group have modulo-X symmetry about the theoretical plane with the second group of the first terminals.

22. The microelectronic assembly of claim 21, wherein the first terminals of said first microelectronic package are coupled through the circuit panel with the first terminals of said second microelectronic package, and the first terminals of the first microelectronic package are aligned within one ball pitch in x and y orthogonal directions parallel to the first and second surfaces of the circuit panel with the corresponding first terminals of the second microelectronic package to which they are coupled.

23. The microelectronic assembly of claim 22, wherein the first terminals of said first microelectronic package have signal assignments which are modulo-X equivalent with said corresponding first terminals of said second microelectronic package to which they are coupled through said circuit panel.

24. The microelectronic assembly of claim 23, wherein the second terminals in the first region of the first microelectronic package are coupled through the circuit panel with the second terminals in the second region of the second microelectronic package, and the second terminals of the first region of the first microelectronic package are aligned within one ball pitch in either one or both of x and y orthogonal directions parallel to the first and second surfaces of the circuit panel with the corresponding second terminals of the second region of the second microelectronic package to which they are coupled.

25. A microelectronic assembly as claimed in claim 20, wherein the circuit panel includes a bus having a plurality of conductors configured to carry all of the address information transferred to each of the microelectronic packages, the conductors extending in a first direction parallel to the first and second surfaces, wherein there is no more than one routing layer for global routing of all of the address information between a connection site on the circuit panel at which the first terminals of the first and second microelectronic packages are electrically connected and a different connection site on the circuit panel at which the first terminals of at least a third microelectronic package are electrically connected.

* * * * *